US010457566B2

(12) United States Patent
Ren et al.

(10) Patent No.: US 10,457,566 B2
(45) Date of Patent: Oct. 29, 2019

(54) LOW-DIMENSIONAL HYPERTHIN $FES_2$ NANOSTRUCTURES FOR ELECTROCATALYSIS

(71) Applicant: University of Kansas, Lawrence, KS (US)

(72) Inventors: Shenqiang Ren, Haverford, PA (US); Kevin C. Leonard, Lawrence, KS (US); Joseph M. Barforoush, Lawrence, KS (US); Daniel Jasion, Lawrence, KS (US)

(73) Assignee: UNIVERSITY OF KANSAS, Lawrence, KS (US)

( * ) Notice: Subject to any disclaimer, the term of this patent is extended or adjusted under 35 U.S.C. 154(b) by 166 days.

(21) Appl. No.: 15/455,350

(22) Filed: Mar. 10, 2017

(65) Prior Publication Data
US 2018/0222767 A1    Aug. 9, 2018

Related U.S. Application Data

(60) Provisional application No. 62/307,191, filed on Mar. 11, 2016.

(51) Int. Cl.
*C01G 49/12* (2006.01)
*C23C 16/30* (2006.01)
(Continued)

(52) U.S. Cl.
CPC ............ *C01G 49/12* (2013.01); *C23C 16/305* (2013.01); *C23C 16/4417* (2013.01); *C25B 1/00* (2013.01);
(Continued)

(58) Field of Classification Search
None
See application file for complete search history.

(56) References Cited

U.S. PATENT DOCUMENTS

2011/0240108 A1   10/2011  Law et al.
2015/0340166 A1   11/2015  Ren et al.

FOREIGN PATENT DOCUMENTS

CN          102797031        11/2012

OTHER PUBLICATIONS

Ennaoui et al., Photoelectrochemical Energy Conversion Obtained with Ultrathin Organo-Metallic-Chemical-Vapor-Deposition Layer of FeS2 (Pyrite) on TiO2, J. Electrochem. Soc., vol. 139, No. 9, Sep. 1992, pp. 2514-2518. (Year: 1992).*

(Continued)

*Primary Examiner* — Karie O'Neill Apicella
(74) *Attorney, Agent, or Firm* — Bell & Manning, LLC

(57) ABSTRACT

Electrodes are provided comprising a $FeS_2$ electrocatalytic material, the $FeS_2$ electrocatalytic material comprising $FeS_2$ nanostructures in the form of $FeS_2$ wires, $FeS_2$ discs, or both, wherein the $FeS_2$ wires and the $FeS_2$ discs are hyperthin having a thickness in the range of from about the thickness of a monolayer of $FeS_2$ molecules to about 20 nm. The $FeS_2$ nanostructures may be polycrystalline comprising a non-pyrite majority crystalline phase. The $FeS_2$ nanostructures may be in the form of $FeS_2$ discs wherein substantially all the $FeS_2$ discs have at least partially curved edges.

20 Claims, 19 Drawing Sheets

(51) Int. Cl.

| | |
|---|---|
| *C30B 7/14* | (2006.01) |
| *C30B 29/46* | (2006.01) |
| *C23C 16/44* | (2006.01) |
| *H01M 4/00* | (2006.01) |
| *H01M 4/04* | (2006.01) |
| *H01M 10/0525* | (2010.01) |
| *C25B 11/04* | (2006.01) |
| *C25B 1/00* | (2006.01) |
| *C25B 1/04* | (2006.01) |
| *C25B 3/04* | (2006.01) |
| *C30B 29/60* | (2006.01) |
| *H01M 4/90* | (2006.01) |

(52) U.S. Cl.
CPC ............. *C25B 1/04* (2013.01); *C25B 3/04* (2013.01); *C25B 11/04* (2013.01); *C30B 7/14* (2013.01); *C30B 29/46* (2013.01); *C30B 29/60* (2013.01); *C01P 2002/82* (2013.01); *C01P 2002/84* (2013.01); *C01P 2004/03* (2013.01); *C01P 2004/04* (2013.01); *C01P 2004/16* (2013.01); *C01P 2004/24* (2013.01); *C01P 2004/50* (2013.01); *C01P 2006/40* (2013.01); *H01M 4/90* (2013.01); *Y02E 60/366* (2013.01)

(56) References Cited

OTHER PUBLICATIONS

Jasion, et al., Low-Dimensional Hyperthin FeS2 Nanostructures for Efficient and Stable Hydrogen Evolution Electrocatalysis, ACS Catal., 5, Oct. 5, 2015, pp. 6653-6657. (Year: 2015).*
Kirkeminde et al., All inorganic iron pyrite nano-heterojunction solar cells, Nanoscale, 4, Sep. 13, 2012, pp. 7649-7654.
Gong et al., Ionic-passivated FeS2 photocapicitors for energy conversion and storage, Chemical Communications, 49, Aug. 8, 2013, pp. 9260-9262.
Gong et al., Iron Pyrite (FeS2) Broad Spectral and Magnetically Responsive Photodetectors, Adv. Optical Mater, 1, Jan. 31, 2013, pp. 78-83.
Gong et al., Symmetry-Defying Iron Pyrite (FeS2) Nanocrystals through Oriented Attachment, Scientific Reports, 3, 2092, Jun. 28, 2013, pp. 1-6.
Jasion et al., Low-Dimensional Hyperthin FeS2 Nanostructures for Efficient and Stable Hydrogen Evolution Electrocatalysis, ACS Catal., 5, Oct. 5, 2015, pp. 6653-6657.
Wadia et al., Materials Availability Expands the Opportunity for Large-Scale Photovoltaics Deployment, Environ. Sci. Technol., 43, Feb. 13, 2009, pp. 2072-2077.
Macpherson et al., Iron Pyrite Nanocubes: Size and Shape Considerations for Photovoltaic Application, ACS Nano, vol. 6, No. 10, Sep. 17, 2012, pp. 8940-8949.
Bai et al., Universal Synthesis of Single-Phase Pyrite FeS2 Nanoparticles, Nanowires, and Nanosheets, J. Phys. Chem. C, 117, Jan. 18, 2013, pp. 2567-2573.
Kirkeminde et al., Synthesis and Optoelectronic Properties of Two-Dimensional FeS2 Nanoplates, ACS Appl. Mater. Interfaces, 4, Feb. 10, 2012, pp. 1174-1177.
Kirkeminde et al., Iron sulfide ink for the growth of pyrite crystals, Nanotechnology 25, 205603, Apr. 30, 2014, pp. 1-6.
Ennaoui et al., Photoelectrochemical Energy Conversion Obtained with Ultrathin Organo-Metallic-Chemical-Vapor-Deposition Layer of FeS2 (Pyrite)on TiO2, J. Electrochem, Soc., vol. 139, No. 9, Sep. 1992, pp. 2514-2518.
Chatzitheodorou et al., Thin Photoactive FeS2 (Pyrite) Films, Mat. Res. Bull., vol. 21, 1986, pp. 1481-1487.
Arico et al., Electrodeposition and characterization of iron sulphide thin films, Materials Letters 13, 1992, pp. 12-17.
Rosso et al., Atomically resolved electronic structure of pyrite {100} surfaces: An experimental and theoretical investigation with implications for reactivity, American Mineralogist, vol. 84, 1999, pp. 1535-1548.
Lukowski et al., Enhanced Hydrogen Evolution Catalysis from Chemically Exfoliated Metallic MoS2 Nanosheets, J. Am. Chem. Soc., 135, Jun. 21, 2013, pp. 10274-10277.
Li et al., MoS2 Nanoparticles Grown on Graphene: An Advanced Catalyst for the Hydrogen Evolution Reaction, J. Am. Chem. Soc., 133, Apr. 21, 2011, pp. 7296-7299.
Jaramillo et al., Identification of Active Edge Sites for Electrochemical H2 Evolution from MoS2 Nanocatalysts, Science, vol. 317, Jul. 6, 2007, pp. 100-102.
Yu et al., Layer-Dependent Electrocatalysis of MoS2 for Hydrogen Evolution, Nano Lett., 14, Jan. 7, 2014, pp. 553-558.
Tokash et al., Electrochemical evaluation of molybdenum disulfide as a catalyst for hydrogen evolution in microbial electrolysis cells, International Journal of Hydrogen Energy, 36, Jun. 16, 2011, pp. 9439-9445.

* cited by examiner

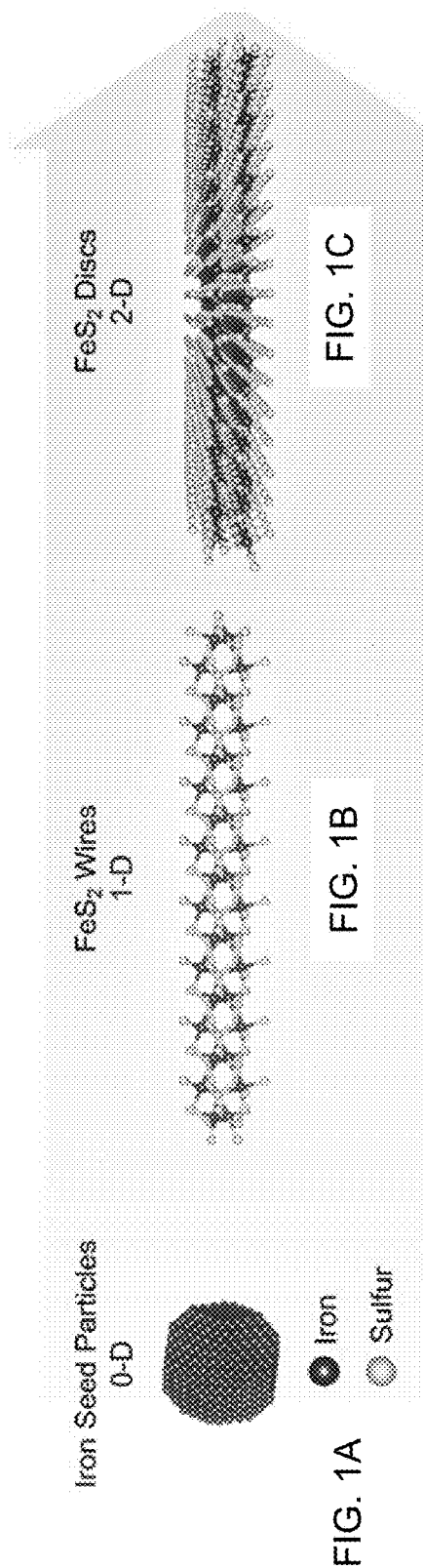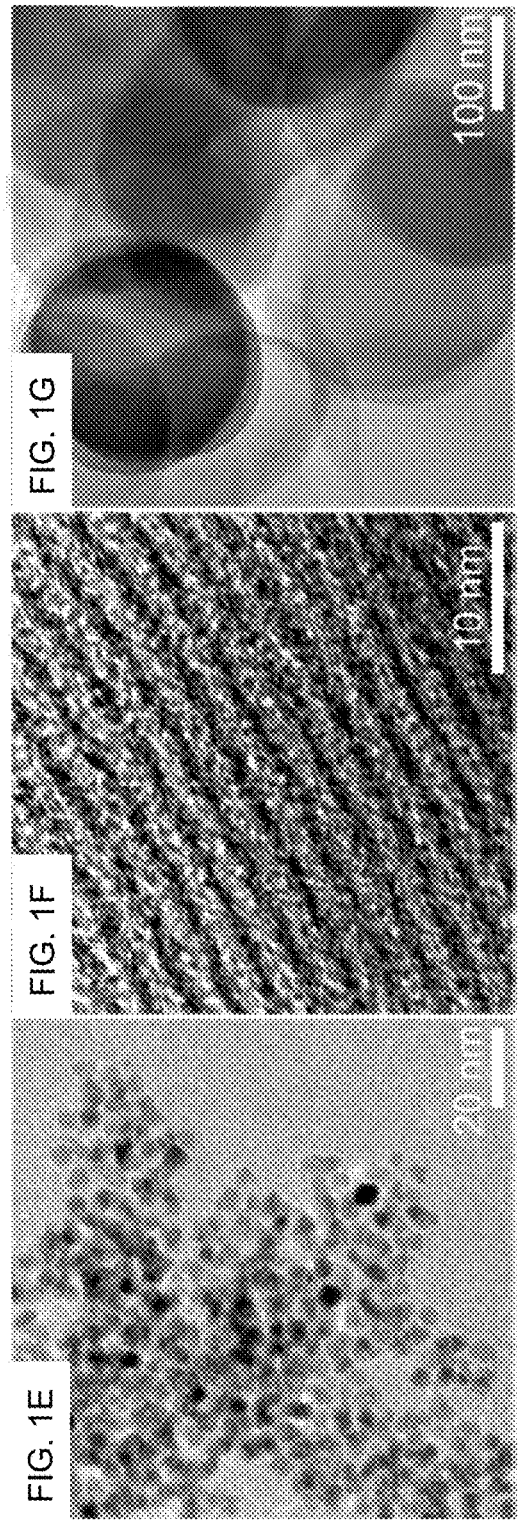

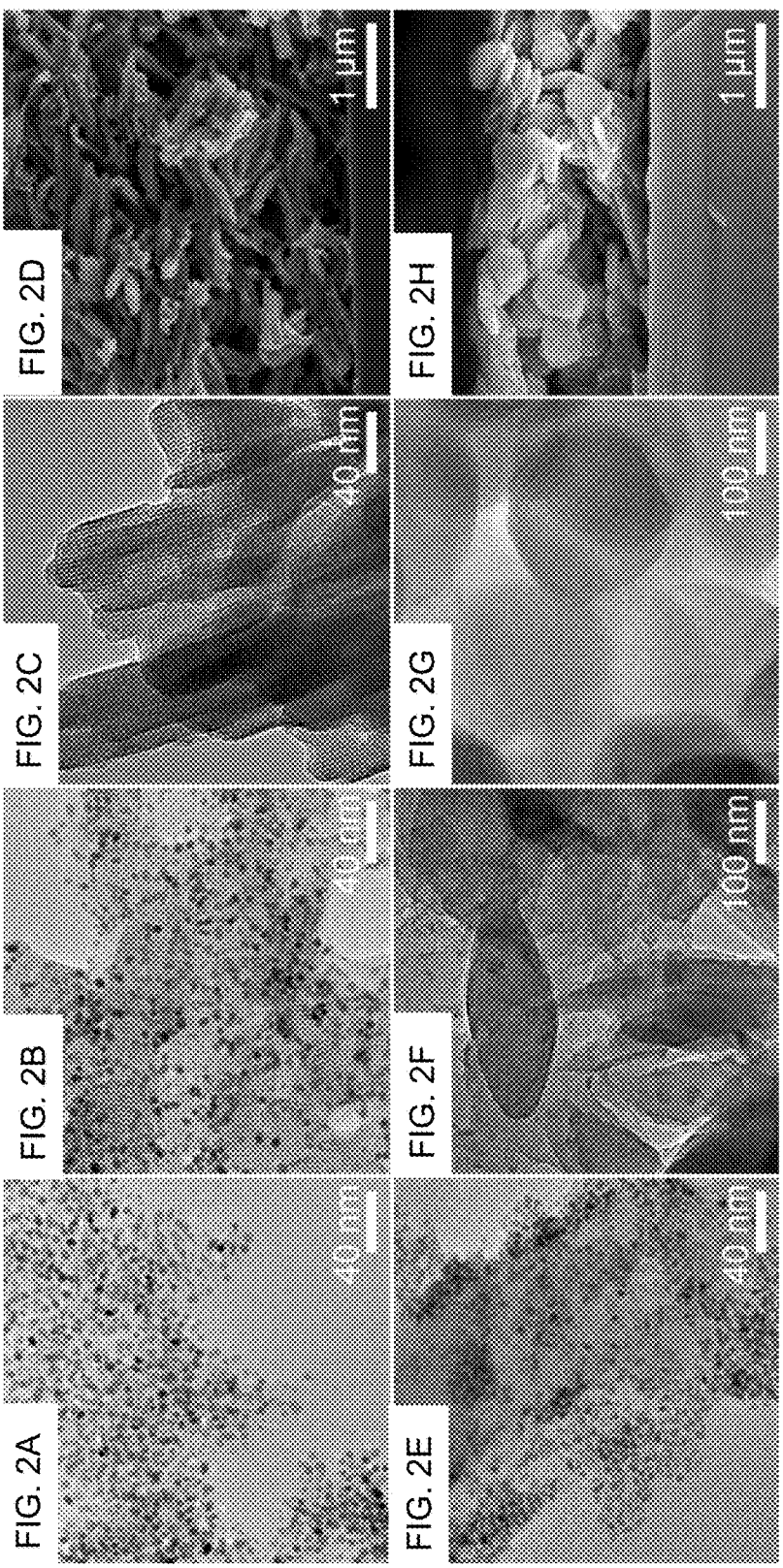

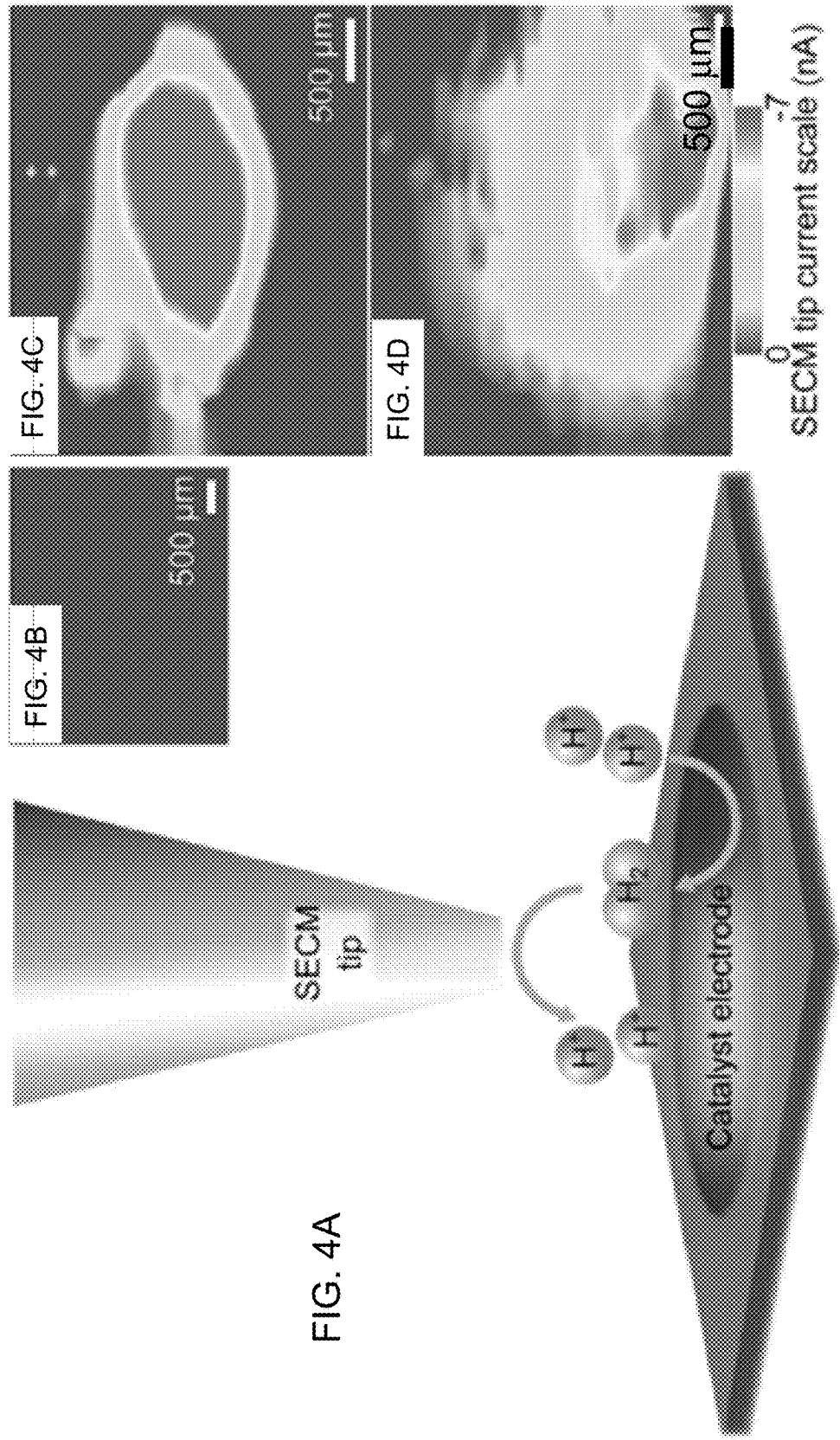

LOW-DIMENSIONAL HYPERTHIN FES$_2$ NANOSTRUCTURES FOR ELECTROCATALYSIS

CROSS-REFERENCE TO RELATED APPLICATIONS

The present application claims priority to U.S. Provisional Patent Application No. 62/307,191 that was filed Mar. 11, 2016, the entire contents of which are hereby incorporated by reference.

REFERENCE TO GOVERNMENT RIGHTS

This invention was made with government support under NSF-DMR-1451326 awarded by the National Science Foundation and under W911NF-14-1-0443 awarded by the Army Research Office. The government has certain rights in the invention.

BACKGROUND

A key green energy initiative is the discovery of efficient, stable, and elemental abundant electrocatalysts for the water splitting reactions, i.e. the hydrogen evolution reaction (HER) and the oxygen evolution reaction (OER).[1-3] Water splitting with HER and OER electrocatalysts play a vital role in converting solar energy into chemical energy via artificial photosynthesis, and also provides a pathway to use water (as opposed to natural gas) as a feedstock for hydrogen production.[4-6] Nanostructured transition-metal chalcogenides have previously been studied as HER electrocatalysts.[7-15] While other transition-metal chalcogenides have also been studied as HER catalysts (e.g. WS$_2$, NiS$_2$, COS$_2$, NiSe$_2$, and CoSe$_2$),[8,16] there have been only limited reports on the catalytic activity of FeS$_2$,[8,17] and none have shown high efficiency for FeS$_2$.

SUMMARY

Provided are FeS$_2$ electrocatalytic materials, electrocatalytic systems comprising the FeS$_2$ electrocatalytic materials, and related methods.

In one aspect, electrodes comprising FeS$_2$ electrocatalytic materials are provided. In an embodiment, an electrode comprises a FeS$_2$ electrocatalytic material, the FeS$_2$ electrocatalytic material comprising FeS$_2$ nanostructures in the form of FeS$_2$ wires, FeS$_2$ discs, or both, wherein the FeS$_2$ wires and the FeS$_2$ discs are hyperthin having a thickness in the range of from about the thickness of a monolayer of FeS$_2$ molecules to about 20 nm. The FeS$_2$ nanostructures may be polycrystalline comprising a non-pyrite majority crystalline phase. The FeS$_2$ nanostructures may be in the form of the FeS$_2$ discs, wherein substantially all the FeS$_2$ discs have at least partially curved edges.

In another aspect, electrochemical systems for catalyzing an electrochemical reaction are provided. In an embodiment, the system comprises an electrochemical cell configured to contain a fluid comprising an electrochemical reactant; the electrode described above in contact with the fluid; a counter electrode in electrical communication with the electrode.

In another aspect, methods for making the electrode described above are provided. In an embodiment, the method comprises injecting a first precursor solution comprising sulfur (S), the first precursor solution having a first temperature, into a second precursor comprising iron (Fe), the second precursor solution having a second temperature, to form a reaction mixture, and allowing the reaction mixture to react at a reaction temperature for a reaction time, wherein a ratio of Fe:S in the first and second precursor solutions is selected to achieve the nanostructures in the form of FeS$_2$ wires, FeS$_2$ discs, or both, wherein the FeS$_2$ wires and the FeS$_2$ discs are hyperthin having the thickness in the range of from about the thickness of a monolayer of FeS$_2$ molecules to about 20 nm. The FeS$_2$ wires and the FeS$_2$ discs may be polycrystalline comprising a non-pyrite majority crystalline phase.

In another aspect, methods of using the electrode described above to catalyze an electrochemical reaction are provided. In an embodiment, the method comprises exposing the FeS$_2$ electrocatalytic material of the electrode described above to a fluid comprising an electrochemical reactant under conditions sufficient to induce the reduction of the electrochemical reactant at the FeS$_2$ electrocatalytic material-fluid interface to form a reduction product or under conditions sufficient to induce the oxidation of the electrochemical reactant at the FeS$_2$ electrocatalytic material-fluid interface to form an oxidation product.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 1A-1C show a schematic representation and FIGS. 1E-1G show TEM images of the 1D and 2D FeS$_2$ structure formation. FIGS. 1A and 1E are the Fe$^0$ nanoparticles that are formed in the absence of sulfur. FIGS. 1B and 1F are the FeS$_2$ wires formed from 1:6 Fe:S precursor solution. FIGS. 1C and 1G are the FeS$_2$ discs formed in the 1:24 Fe:S precursor.

FIGS. 2A-2C show the time dependent TEM characterization for the wires at 0.5, 5, and 240 minutes, respectively. FIGS. 2E-2G shows the time dependent TEM characterization for the discs at 0.5, 5, and 240 minutes, respectively. FIGS. 2D, 2H show SEM characterization of the final wire and disc formations cast on Si substrates, respectively.

FIG. 3A shows experimental linear sweep voltammograms at 1 mV/s (solid lines) for the champion FeS$_2$ discs, wires, and cubes coated on glassy carbon along with a bare Pt electrode and a bare glassy carbon electrode. Also shown are the corresponding best-fit single-electron Butler-Volmer equations (dashed lines) for each electrode. FIG. 3B shows a Tafel plot showing the experimental data in the Tafel region (circle markers) with the corresponding Tafel slopes (solid lines) for Pt, FeS$_2$ discs, wires, and cubes.

FIGS. 4A-4D show hydrogen evolution electrochemical reactivity maps obtained via scanning electrochemical microscopy (SECM). FIG. 4A shows a schematic of the SECM experiment showing hydrogen collection on the SECM tip electrode. FIG. 4B shows the reactivity map for bare glassy carbon electrode. FIGS. 4C and 4D show electrochemical reactivity maps for the HER on Pt and $FeS_2$ discs on glassy carbon, respectively.

FIG. 6B shows a high resolution TEM image of the $FeS_2$ disc observed from its [001] direction, FFT of the squared area (insert) shows diffraction peaks from (020), (110) and (200) planes.

DETAILED DESCRIPTION

Provided are $FeS_2$ electrocatalytic materials, electrocatalytic systems comprising the $FeS_2$ electrocatalytic materials, and related methods. The invention is based, at least in part, on the discovery of certain $FeS_2$ electrocatalytic materials (and methods for making the materials) which exhibit greatly superior catalytic performance as compared to earth-abundant $FeS_2$. Moreover, the catalytic performance is comparable to platinum in neutral pH conditions and the catalytic activity is maintained over long periods of time (e.g., hundreds of hours), thereby facilitating the practical use of the $FeS_2$ electrocatalytic materials for catalyzing certain electrochemical reactions, including the hydrogen evolution reaction (HER), for the first time.

The $FeS_2$ electrocatalytic materials comprise nanostructured $FeS_2$. "Nanostructured $FeS_2$" refers to a solid material of $FeS_2$ in the form of distinct, distinguishable nanostructures (e.g., as visualized via transmission electron microscope (TEM) images) having at least one dimension of about 1000 nm or less or about 100 nm or less. The nanostructures may be characterized by their shape and dimensions. In some embodiments, the nanostructures are wires characterized by a length $l_w$, width $w_w$, and thickness $t_w$, wherein $l_w \gg w_w, t_w$. The width $w_w$ and thickness $t_w$ may be of similar magnitudes. When $w_w \sim t_w$, the wires may be characterized by a length $l_w$ and a diameter $d_w$, although the cross-sectional shape of the wires may not be perfectly circular.

In other embodiments, the nanostructures are discs characterized by a length $l_d$, width $w_d$, and thickness $t_d$, wherein $l_d, w_d \gg t_d$. The length $l_d$ and width $w_d$ and may be of similar magnitudes. The discs may be characterized by the curvature of its outer perimeter, i.e., its edge. The discs may have at least a partially curved edge. This means that at least a portion of the edge is curved, although other portions of the edge may be non-curved, i.e., characterized by a straight line. In embodiments, the entire edge is curved along its length. The degree of curvature may be the same or different along the length of the edge.

The discs may also be characterized by the overall shape defined by their edges. The discs may be characterized as being circular or elliptical. The terms are not meant to imply that the shapes are perfectly regular. For example, in some embodiments, a disc may have a portion of its edge which is straight and the remaining portion curved. Moreover, the degree of curvature along the curved portion may vary. However, these terms do distinguish discs which have all straight edges and generally sharp corners, e.g., hexagonally shaped discs.

Figure 11A:
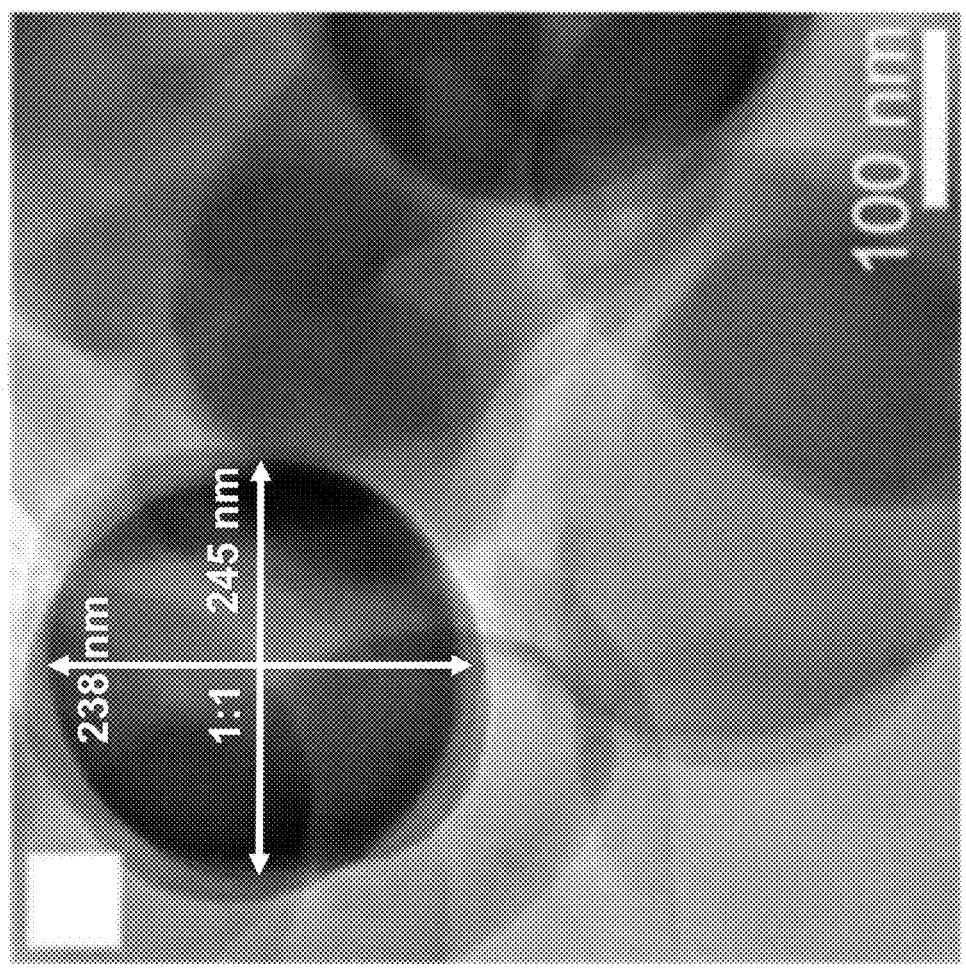
FIG. 11A shows a TEM image of a circular $FeS_2$ 2D disc having an entirely curved edge.
Figure 11B:
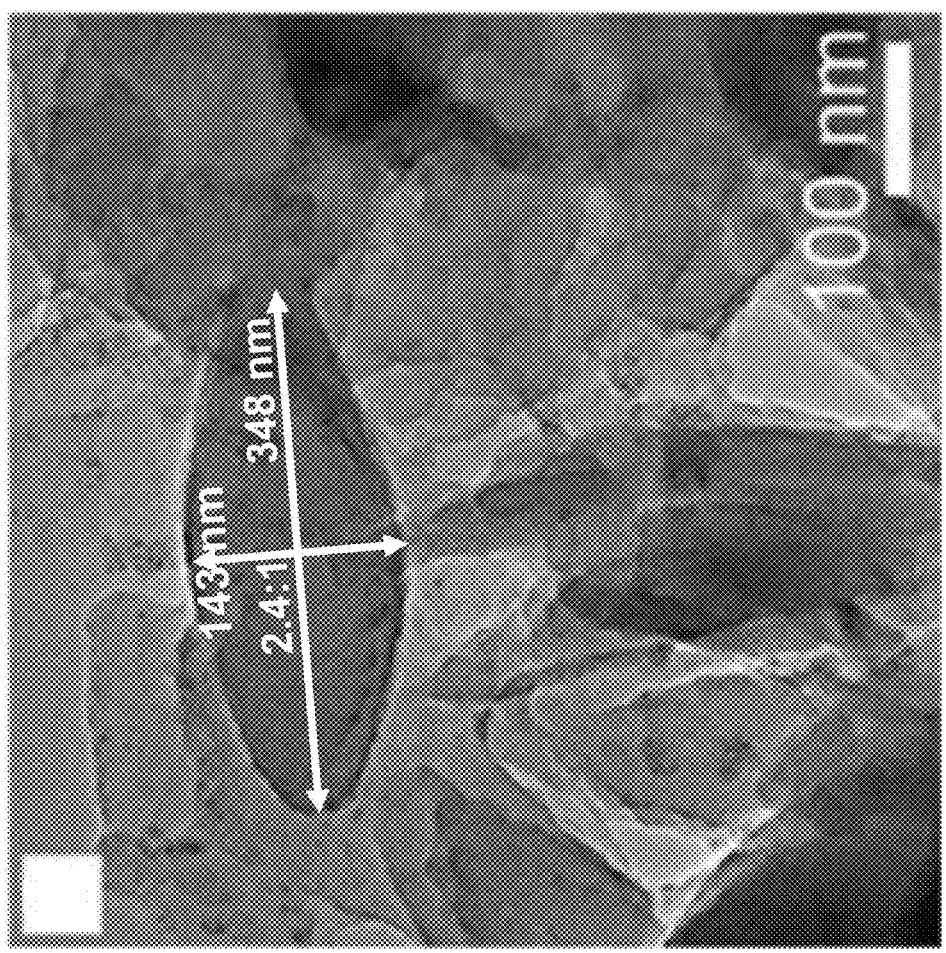
FIG. 11B shows a TEM image of an elliptical $FeS_2$ 2D disc having an entirely curved edge.
Figure 11C:
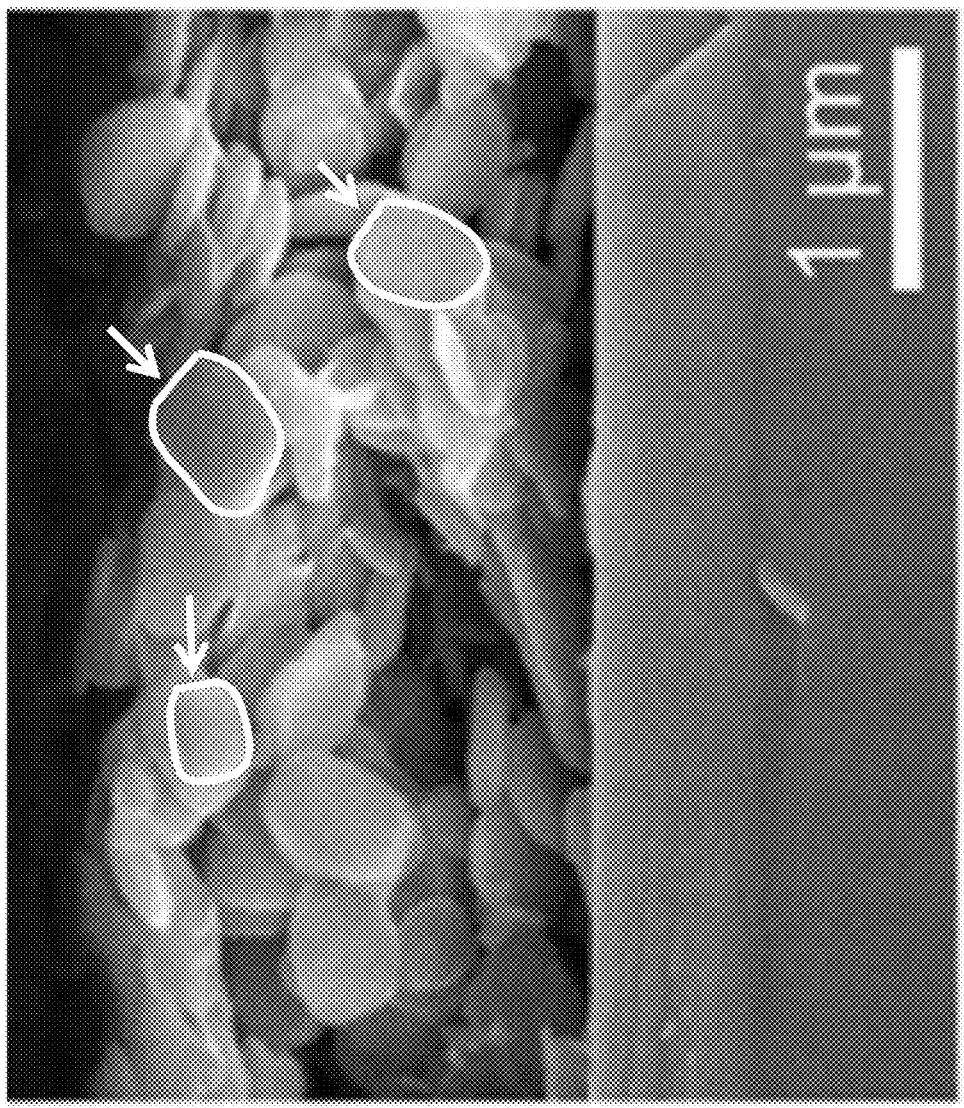
FIG. 11C shows a SEM image including elliptical $FeS_2$ 2D discs in which a portion of each edge is straight.

FIG. 11A shows a TEM image in which a circular disc is labeled. In embodiments, circular discs may be characterized by a diameter $d_d$. In such cases $d_d \gg t_d$. As shown in the figure, the circular disc has $l_d$=245 nm and $w_d$=238 nm. Since $l_d \sim w_d$, the plane of the disc can be defined by a circle having a diameter $d_d$ of about 240 nm. The entire edge of this circular disc is curved. FIG. 11B shows a TEM image in which an elliptical disc is labeled. In embodiments, elliptical discs may be characterized by a major diameter $d_{d,\ major}$ and a minor diameter $d_{d,\ minor}$. In such cases $d_{d,\ major}$ and $d_{d,\ minor} \gg t_d$. As shown in the figure, the elliptical disc has $d_{d,\ major}$=348 nm and $d_{d,\ minor}$=143 nm. The entire edge of this disc is curved. FIG. 11C shows a SEM image of a plurality of $FeS_2$ 2D discs. Three discs are outlined. These discs each have a portion of the edge which is straight (indicated by the arrows) with the remainder of the edge curved. These discs may still be characterized as being elliptical.

In embodiments, substantially all the nanostructures of the $FeS_2$ electrocatalytic material are in the form of the discs. By "substantially" it is meant that the nanostructures may include a small amount of a different type of nanostructure, but that the different type of nanostructure does not materially affect the catalytic properties of the $FeS_2$ electrocatalytic material. In other words, the catalytic properties of the $FeS_2$ electrocatalytic material are controlled by the discs.

In embodiments, substantially all the discs have at least a partially curved edge. In embodiments, at least about 25% of the discs have edges which are entirely curved. This includes embodiments in which the amount is at least about 50% or at least about 75%. In embodiments, substantially all the discs have entirely curved edges. In embodiments, substantially all the discs are either circular or elliptical. In each case, the term "substantially" has a meaning analogous to that described above.

Without wishing to be bound to any particular theory, it is thought that the presence of curved edges is related to the catalytic efficiency of the $FeS_2$ nanostructures. Curved edges may provide catalytically active edge sites which allow optimal adsorption of key reaction intermediates due to the presence of stretched and/or dangling bonds. Such stretched/dangling bonds would not be as concentrated at straight edges where $FeS_2$ molecules would be better able to orient into a bonding configuration.

The nanostructures are "hyperthin," by which it is meant the nanostructures have at least one dimension in the range of from about the thickness of a monolayer of $FeS_2$ molecules to about 20 nm. This includes embodiments in which the nanostructures have at least one dimension which is at least about the thickness of a monolayer of $FeS_2$ molecules, a bilayer of $FeS_2$ molecules, or a trilayer of $FeS_2$ molecules but less than about 20 nm, about 15 nm, about 10 nm, or about 5 nm. The thickness may be that of a monolayer of $FeS_2$ molecules, a bilayer of $FeS_2$ molecules, or a trilayer of $FeS_2$ molecules. The thickness may be in the range of from about 0.1 nm to about 20 nm, from about 0.1 nm to about 10 nm, from about 0.1 nm to about 5 nm, or from about 0.1 to about 1 nm.

Figure 1D:
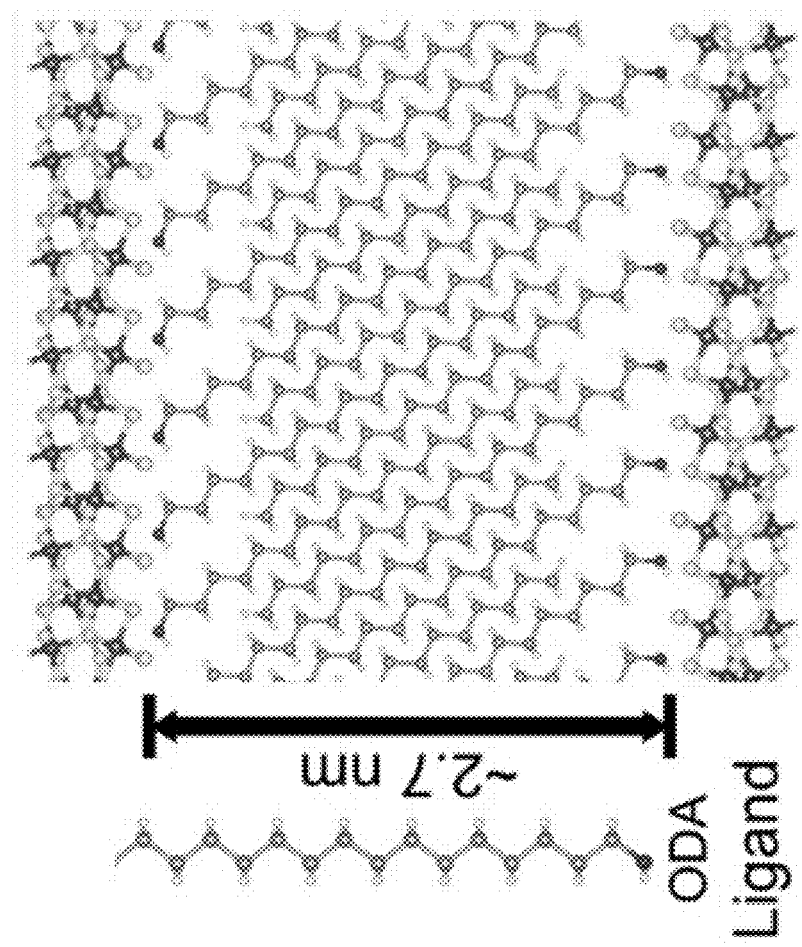
FIG. 1D is the schematic of ~2.7 nm wide ligand interstitial layer that separates both wires and discs to form their respective bulk structures.

In some embodiments, the nanostructures are hyperthin wires in which $t_w$ (or $d_w$) is the hyperthin dimension having the values as described in the paragraph immediately above. The term "1D" (one dimensional) may be used to describe such nanostructures. The length $l_w$ of the hyperthin wires is not particularly limited. In some embodiments, the length is at least about 50 nm. This includes embodiments in which the length is at least about 100 nm, about 500 nm, about 1 µm, about 5 µm, about 10 µm, about 100 µm or in the range of from about 50 nm to about 100 µm. FIG. 1B shows a schematic illustration of a hyperthin 1D $FeS_2$ wire.

In other embodiments, the nanostructures are hyperthin discs in which $t_d$ is the hyperthin dimension having the values as described with respect to the hyperthin wires. The term "2D" (two dimensional) may be used to describe such nanostructures. The other dimensions of the hyperthin discs (e.g., $l_d$, $w_d$ (or $d_d$) are not particularly limited. In some embodiments, these dimensions may assume a value of at least about 50 nm. This includes embodiments in which the dimensions are at least about 100 nm, about 500 nm, about 1 µm, about 5 µm, about 10 µm, or in the range of from about 50 nm to about 10 µm. FIG. 1C shows a schematic illustration of a hyperthin 2D $FeS_2$ disc.

Figure 2I:
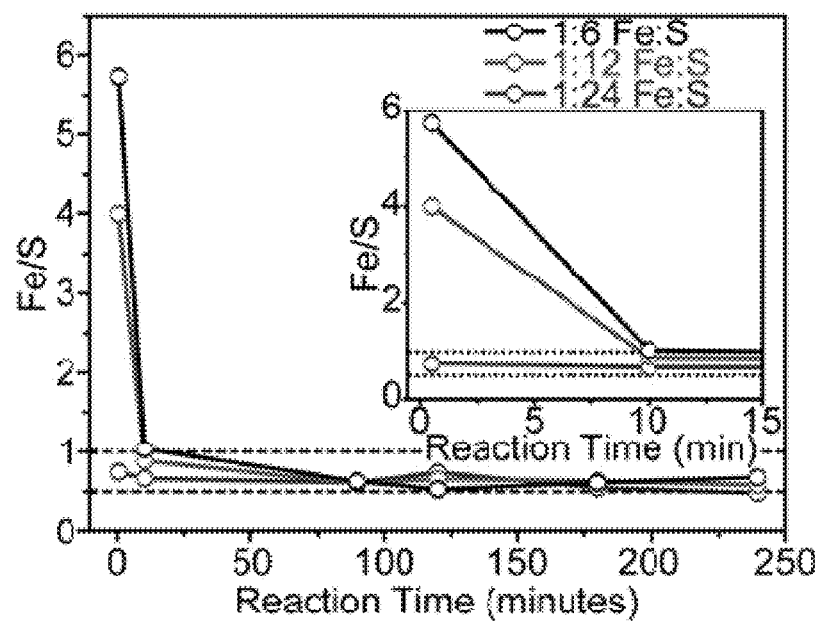
FIG. 2I shows time dependent EDS measurements with the inset focusing on the first 15 minutes of the reaction.
Figure 7:
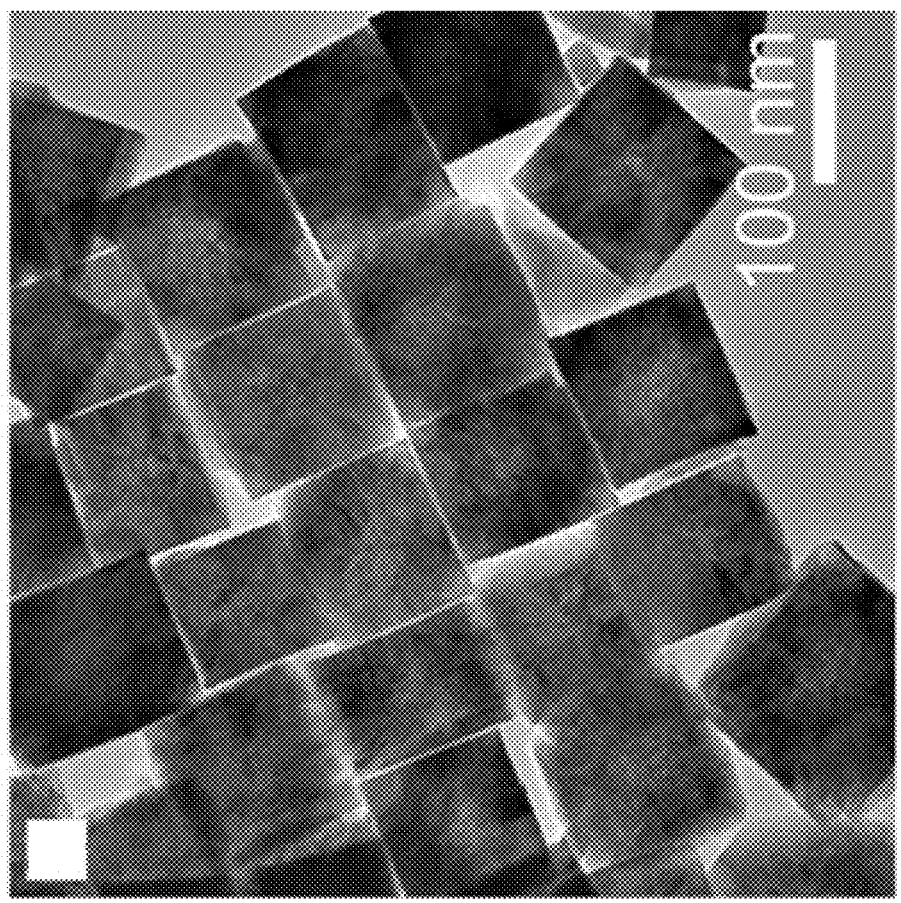
FIG. 7 shows a TEM image of the 3D cubes for comparison to wire and disc structures.

Hyperthin nanostructures may also be identified by their transparency as their extreme thinness renders them significantly more transparent as compared to thicker nanostructures (e.g., compare the TEM images showing transparent hyperthin 1D $FeS_2$ wires in FIG. 2C and transparent hyperthin 2D $FeS_2$ discs in FIG. 2G to opaque cubes in FIG. 7). In some embodiments, the hyperthin nanostructures exhibit a transparency in the range of from about 40% to about 60% at about 200 keV or of about 50% at about 200 keV.

The nanostructures do not include nanoparticles, nanocubes (FIG. 7), or similar nanostructures in which all three dimensions of the nanostructures are of similar magnitude. The term "3D" (three-dimensional) is used in the Examples to describe such nanostructures.

$FeS_2$ electrocatalytic materials comprising combinations of nanostructures having different shapes may be used. The numeric values for the dimensions described above may refer to the average value of a collection of nanostructures.

$FeS_2$ electrocatalytic materials may be characterized by the phase of the material. In embodiments, the $FeS_2$ electrocatalytic material is polycrystalline, i.e., comprising more than one crystalline phase (as opposed to single crystalline composed of a single crystalline phase). Polycrystalline can also refer to $FeS_2$ electrocatalytic materials comprising regions of amorphous phase (lacking any crystalline order) in addition to one or more crystalline phases. The $FeS_2$ electrocatalytic materials may be further characterized by the identity of the majority phase in the material, i.e., the phase which is present at the greatest amount. In embodiments, the $FeS_2$ electrocatalytic material is polycrystalline comprising non-pyrite majority crystalline phase. This means that the crystalline phase present in the greatest amount is not pyrite phase. In embodiments, the $FeS_2$ electrocatalytic material is polycrystalline comprising marcasite as the majority crystalline phase. This includes embodiments in which there is greater than 50% marcasite phase, greater than 60%, greater than 70%, or greater than 80%. In such embodiments, other crystalline phases which may be present at smaller amounts include pyrite phase and pyhrrotite phase. As noted above, amorphous phase may also be present. The phase of the $FeS_2$ electrocatalytic materials can be evaluated using High Resolution Transmission Electron Microscopy and electron diffraction as described in the Example, below.

The $FeS_2$ electrocatalytic materials are distinguished from conventional $FeS_2$ materials which are highly crystalline, i.e., substantially single-crystalline, and $FeS_2$ materials which may be polycrystalline but comprise pyrite phase as the majority crystalline phase. On this basis, the $FeS_2$ electrocatalytic materials are distinguished from the materials described in the following references: Macpherson, H. A., et al., *ACS Nano* 2012, 6, 8940-8949; Bai, Y. X., et al., *J. Phys. Chem. C* 2013, 117, 2567-2573; Kirkeminde, A., et al., *ACS Appl. Mater. Interfaces* 2012, 4, 1174-1177; Kirkeminde, A., et al., *Nanotechnology* 2014, 25, 205603; Ennaoui, A., et al., *J. Electrochem. Soc.* 1992, 139, 2514-2518; and Gong, M., et al., *Sci. Rep.* 2013, 3, 2092. Despite the lack of phase purity of the present $FeS_2$ electrocatalytic materials as compared to the conventional $FeS_2$ materials, it has been found that the present materials have extremely high catalytic efficiencies, e.g., for the hydrogen evolution reaction.

Individual nanostructures may assemble together in the presence of a ligand to form a larger structure (e.g., a "microstructure") in which the individual nanostructures are held together via ligand-ligand interactions. By way of illustration, a plurality of hyperthin 1D $FeS_2$ wires may assemble to form a bundle of hyperthin 1D $FeS_2$ wires, wherein neighboring wires are substantially aligned (i.e., aligned, but not necessarily perfectly aligned) along their lengths and separated by a ligand layer. (See, e.g., FIGS. 1D and 1F.) As shown schematically in FIG. 1D, the "heads" of ligand molecules bind to the surface of the 1D $FeS_2$ wires, thereby decorating the length of the 1D $FeS_2$ wires. The "tails" of the ligand molecules bind to each other, thereby associating neighboring 1D $FeS_2$ wires. The spacing between neighboring wires due to the ligand can be about the length of the ligand, e.g., less than about 5 nm, less than about 4 nm, in the range of from about 2 nm to about 3 nm. The bundles themselves are generally distinct, identifiable structures, although the overall shape and dimensions of individual bundles may vary. (See, e.g., FIGS. 2C and 2D.) The bundles may be randomly oriented with respect to one another to define a plurality of irregularly shaped pores in the $FeS_2$ electrocatalytic material. (See, e.g., FIG. 2D.)

Similarly, a plurality of hyperthin 2D $FeS_2$ discs may assemble to form a stack of hyperthin 2D $FeS_2$ discs, wherein neighboring discs are substantially aligned (i.e., aligned, but not necessarily perfectly aligned) along their planes and separated by a ligand layer. The spacing between neighboring discs may be as described above with respect to the bundles of wires. The stacks themselves are generally distinct, identifiable structures, although the overall shape and dimensions of individual stacks may vary. (See, e.g., FIG. 2H.) The stacks may be randomly oriented with respect to one another to define a plurality of irregularly shaped pores in the FeS$_2$ electrocatalytic material. (See, e.g., FIG. 2H.)

The ligand which facilitates the formation of the larger structures may be that which is used in making the nanostructured FeS$_2$, as further described below.

The nanostructured FeS$_2$, including nanostructured FeS$_2$ assembled via ligand-ligand interactions to form microstructures, may be used in the form of a film, layer, or coating on an underlying substrate to provide an electrode. A variety of substrates may be used. The substrate is typically a conductive substrate. By way of illustration, carbon substrates (e.g., glassy carbon) may be used.

In addition to the ligand described above, the FeS$_2$ electrocatalytic material may comprise other components, e.g., binders, fillers, etc. The particular components and amount of components may depend upon the electrochemical reaction to be catalyzed. For catalyzing the HER, the binder may be an ionic conductor, e.g., an ionomer. Perfluorinated ionomers may be used, e.g., Nafion. The FeS$_2$ electrocatalytic material may comprise such binders in an amount from about 0.01% to about 25% by weight of the material, from about 0.5% to about 15% by weight of the material, or from about 10% to about 15% by weight of the material. For the HER, the filler may be conductive carbon, e.g., carbon black such as acetylene black. The FeS$_2$ electrocatalytic material may comprise such fillers in an amount from about 1% to about 50% by weight of the material, from about 5% to about 25% by weight of the material, or from about 5% to about 15% by weight of the material.

The FeS$_2$ electrocatalytic material may be used to catalyze a variety of electrochemical reactions. In one embodiment, the FeS$_2$ electrocatalytic material may be used to catalyze the hydrogen evolution reaction (HER), an electrochemical reaction in which hydrogen (H$_2$) is produced via the electrolysis of water (H$_2$O). The hydrogen evolution reaction may be carried out in an electrochemical cell comprising an anode and a cathode in contact with an electrolyte solution (e.g., a solution of water and a water-soluble electrolyte such as H$_2$PO$_4$). The hydrogen evolution reaction may be conducted at about neutral pH (pH ~7). Application of an electrical potential across the anode and the cathode causes dissociated hydrogen ions (H$^+$) to migrate to the cathode where they are reduced by free electrons to produce H$_2$. The hydrogen gas may desorb from the cathode and be collected from the electrochemical cell. At the anode, water reacts to form oxygen (O$_2$), hydrogen ions and electrons. The FeS$_2$ electrocatalytic material may be used to catalyze the reduction reaction of HER, i.e., the reduction of hydrogen ions to H$_2$ at the cathode. The FeS$_2$ electrocatalytic material may also be used to catalyze the direct reduction of water, i.e., $2H_2O+2e^- \rightarrow H_2+2OH^-$.

In another embodiment, the FeS$_2$ electrocatalytic material may be used to catalyze the reduction of carbon dioxide (CO$_2$), an electrochemical reaction in which formate, carbon monoxide (CO), other oxygenated carbon compounds, or hydrocarbons is produced. The CO$_2$ reduction may be carried out in an electrochemical cell comprising an anode and a cathode in contact with an electrolyte solution (e.g., a solution of water and a water-soluble electrolyte such as Na$_2$SO$_4$; an ionic liquid such as 1-hexyl-3-methylimidazolium bis(trifluoromethylsulfonyl)imide; or an organic solvent such as acetonitrile and an organic-soluble electrolyte such as tetrabutylammonium hexafluorophosphate). The CO$_2$ reduction may be conducted at a pH in the range of 4 to 8. Application of an electrical potential across the anode and the cathode causes dissolved CO$_2$ molecules to migrate to the cathode where they are reduced by free electrons to produce the radical, CO$_2\cdot^-$, which will react further to form the final product(s). The liquid or gas products may be collected from the electrochemical cell. In a solution of water, water reacts to form O$_2$, hydrogen ions and electrons. The FeS$_2$ electrocatalytic material may be used to catalyze the reduction of CO$_2$, i.e., the reduction of CO$_2$ at the cathode.

Other electrochemical reactions which may be catalyzed by the FeS$_2$ electrocatalytic materials include oxidation reactions. In one embodiment, the FeS$_2$ electrocatalytic material may be used to catalyze the oxidation of H$_2$ to produce protons and free electrons at the anode of a hydrogen fuel cell. The protons are drawn through an electrolyte solution in contact with the anode to the cathode. The free electrons are also drawn from the anode to the cathode through an external circuit to produce electricity. At the cathode, an oxidizing agent such as O$_2$ reacts with the protons and some of the free electrons to produce water.

The FeS$_2$ electrocatalytic material may be characterized by its efficiency at catalyzing a particular electrochemical reaction, e.g., HER. In some embodiments, the efficiency is provided as the overpotential at 0.1 mA/cm$^2$ as determined in a 0.1 M phosphate buffer at a pH of 7 and a scan rate of 1 mV/s. In such embodiments, the FeS$_2$ electrocatalytic material may be characterized by an efficiency (overpotential) of no more than about 90 mV, no more than about 80 mV, or no more than 70 mV.

The FeS$_2$ electrocatalytic material may be characterized by its stability in catalyzing a particular electrochemical reaction over a period of time. In some embodiments, the FeS$_2$ electrocatalytic material is characterized by the ability to generate H$_2$ by catalyzing the hydrogen evolution reaction, wherein the amount of generated H$_2$ remains substantially the same (e.g., within about ±5%, about ±10%, about ±15% of the amount generated at an initial time point) for up to about 24 hours, 50 hours, 100 hours, 125 hours, 150 hours, 200 hours, etc. Even greater stabilities may be achieved, e.g., on the order of years. These values may refer to the stability at a neutral pH when measured as described in the Example, below.

As demonstrated in the Example, below, it has been found that hyperthin 2D FeS$_2$ discs are particularly efficient at catalyzing the reduction reaction of HER to generate H$_2$. Notably, the increased efficiency of the hyperthin 2D FeS$_2$ discs as compared to hyperthin 1D FeS$_2$ wires is greater than would be expected based on the increased surface area provided by the hyperthin 2D FeS$_2$ discs. In particular, the ratio of the electrochemical surface area for discs/wires was determined to be about 2, while the ratio of the exchange current density for discs/wires was determined to be between 5 to 7 (see Example).

Electrocatalytic systems comprising the FeS$_2$ electrocatalytic materials are also provided. The electrochemical system may comprise an electrochemical cell configured to contain a fluid comprising an electrochemical reactant (e.g., a species to be reduced to form a reduction product or a species to be oxidized to form an oxidation product); a working electrode comprising a FeS$_2$ electrocatalytic material in contact with the fluid; and a counter electrode. Any of the FeS$_2$ electrocatalytic materials described herein may be used. The selection of fluid depends upon the particular electrochemical reaction to be catalyzed. For the hydrogen evolution reaction, the fluid may be an electrolyte solution (e.g., a solution of water and a water-soluble electrolyte), the electrochemical reactant may comprise hydrogen ions and the reduction product may comprise H$_2$. Various materials for the counter electrode may be used (e.g., Pt wire). The working electrode and the counter electrode may be immersed in the fluid. The counter electrode may be in electrical communication with the working electrode.

The electrocatalytic system may further comprise a power source in electrical communication with the working electrode and the counter electrode, the power source configured to apply an electrical potential across the working electrode and the counter electrode in order to generate free electrons for electrochemically inducing the reduction reaction at the working electrode. Other components may be used in the electrocatalytic system, e.g., a membrane separating the electrodes, a collection cell configured to collect the reduction product from the electrochemical cell, etc.

The electrocatalytic system may be configured as a hydrogen fuel cell, in which case the fluid may be $H_2$, the electrochemical reactant may comprise the $H_2$ and the oxidation product may comprise hydrogen ions and free electrons.

Figure 12:
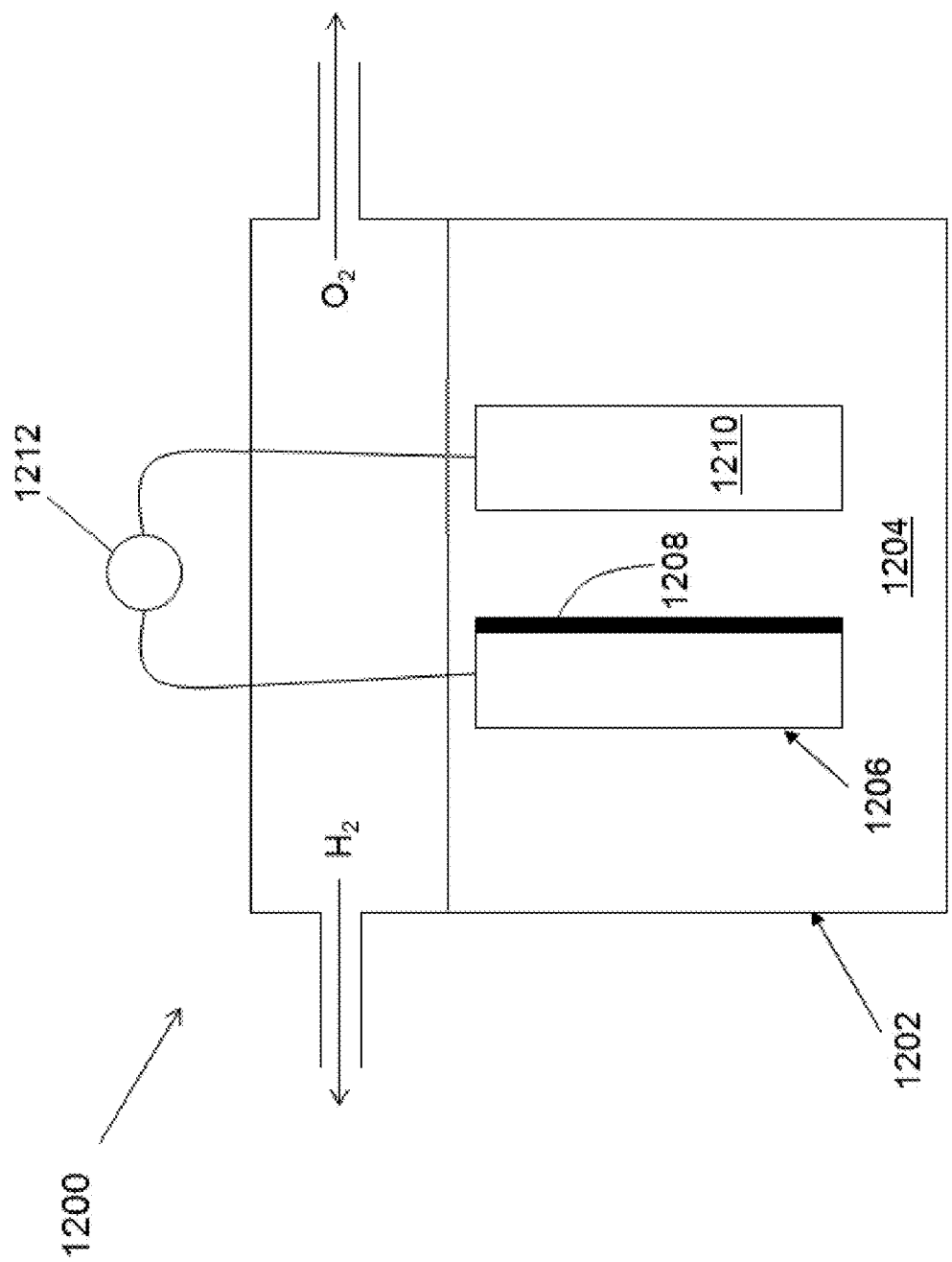
FIG. 12 shows a schematic of an illustrative electrochemical system including a working electrode based on a $FeS_2$ electrocatalytic material. The electrochemical system may be used to catalyze the hydrogen evolution reaction.

An illustrative electrocatalytic system 1200 which may be used to carry out the hydrogen evolution reaction is shown in FIG. 12. The electrochemical system may comprise an electrochemical cell 1202 configured to contain an aqueous electrolyte solution 1204; a working electrode 1206 comprising a $FeS_2$ electrocatalytic material 1208 in contact with the solution 1204; and a counter electrode 1210. A power source 1212 is configured to apply an electrical potential across the working electrode 1206 and the counter electrode 1210 in order to generate free electrons for electrochemically inducing the reduction reaction at the working electrode 1206.

Methods of making the $FeS_2$ electrocatalytic materials are also provided. In one embodiment, the method may comprise injecting a first precursor solution comprising sulfur, the first precursor solution having a first temperature, into a second precursor comprising iron, the second precursor solution having a second temperature, to form a reaction mixture and allowing the reaction mixture to react at a reaction temperature for a reaction time to provide a $FeS_2$ electrocatalytic material comprising nanostructured $FeS_2$. It has been found that the reaction temperature and the ratio of Fe:S in the first and second precursor solutions may be selected to achieve hyperthin $FeS_2$ nanostructures having at least one hyperthin dimension having the values as described above and having a selected shape. Of these, the Fe:S, the ratio has been found to be particularly critical to achieving hyperthin 1D $FeS_2$ wires, hyperthin 2D $FeS_2$ discs, or a combination thereof. Moreover, it has been found that a much higher amount of sulfur is required to obtain these structures as compared to the stoichiometry of the final structures (i.e., 1:2 Fe:S). By way of illustration, a Fe:S ratio in the range of from about 1:4 to about 1:12 may be used to achieve hyperthin 1D $FeS_2$ wires (including from about 1:6 to about 1:10 or about 1:8); a Fe:S ratio in the range of from about 1:24 to about 1:38 may be used to achieve hyperthin 2D $FeS_2$ discs (including from about 1:28 to about 1:36 or from about 1:30 to about 1:34 or about 1:32); and a Fe:S ratio in the range of from about 1:12 to about 1:20 may be used to achieve a combination of hyperthin 1D $FeS_2$ wires and hyperthin 2D $FeS_2$ discs (including from about 1:14 to about 1:18 or about 1:16). These ratios are molar (atomic) ratios.

Regarding the reaction temperature, the reaction temperature may be in the range of from about 90° C. to about 160° C., from about 100° C. to about 150° C., or from about 110° C. to about 130° C. The reaction time may be selected to achieve the desired 1:2 stoichiometry. The reaction may take place under inert conditions (e.g., in a degassed and inert gas filled flask).

The first precursor solution comprises sulfur (e.g., elemental sulfur) and a first solvent. A variety of first solvents may be used (e.g., phenyl ether). The first temperature of the first precursor solution may assume different values, but is generally greater than room temperature. The first precursor solution may be made by mixing sulfur and the first solvent under heat and inert conditions for a period of time.

The second precursor solution comprises iron, a ligand and a second solvent. The iron may be derived from a decomposed iron precursor (e.g., an iron salt such as $FeI_2$) in the second precursor solution. A variety of ligands may be used, provided they are capable of acting as a reducing agent for $Fe^{2+}$ and as a capping layer on nanostructured $FeS_2$. Suitable ligands include alkylamines. The alkyl groups having various numbers of carbon atoms may be used, e.g., from 2 to 30, from 6 to 30, from 10 to 30, etc. Octadecylamine (ODA) is a suitable ligand. A variety of second solvents may be used (e.g., phenyl ether). The second precursor solution may be made by injecting an iron precursor solution comprising the iron precursor and the second solvent into the ligand and mixing the second precursor solution under heat and inert conditions for a period of time sufficient to induce decomposition of the iron precursor. The second temperature of the second precursor solution may assume different values, but is generally greater than room temperature and may be about the reaction temperature. The iron precursor solution may be made by mixing the iron precursor in a third solvent (e.g., phenyl ether) under inert conditions for a period of time.

The Example below provides additional details (e.g., illustrative suitable conditions, etc.) regarding the method of making the $FeS_2$ electrocatalytic materials.

Methods of using the $FeS_2$ electrocatalytic material to catalyze an electrochemical reaction are also provided. In one embodiment, the method may comprise exposing a $FeS_2$ electrocatalytic material to a fluid comprising an electrochemical reactant. If the electrochemical reactant is a species to be reduced (e.g., hydrogen ions), the exposure may occur in the presence of free electrons. The free electrons induce the reduction of the electrochemical reactant at the $FeS_2$ electrocatalytic material-fluid interface to form a reduction product (e.g., $H_2$), which may be separated from the fluid and collected. The free electrons may be derived from an external power source in electrical communication with the $FeS_2$ electrocatalytic material. If the electrochemical reactant is a species to be oxidized (e.g., $H_2$), the exposure results in the production of an oxidation product (e.g., hydrogen ions and free electrons), the free electrons which may be collected via an external circuit in electrical communication with the $FeS_2$ electrocatalytic material. The conditions under which the FeS2 electrocatalytic material is exposed in such methods depends upon the nature of the electrochemical reaction. However, these conditions will be known. By way of illustration, the conditions for achieving the reduction of water to produce hydrogen gas via the hydrogen evolution reaction are described in the Example below.

EXAMPLE

In this Example, a scalable, solution-processing method for synthesizing low-dimensional hyperthin $FeS_2$ nanostructures is provided. It is also shown that 2D $FeS_2$ disc nanostructures are an efficient and stable hydrogen evolution electrocatalyst. By changing the Fe:S ratio in the precursor solution, it was possible to preferentially synthesize either 1D wire or 2D disc nanostructures. The 2D $FeS_2$ disc structure has the highest electrocatalytic activity for the hydrogen evolution reaction, comparable to platinum in neutral pH conditions. The ability of the $FeS_2$ nanostructures to generate hydrogen was confirmed by scanning electrochemical microscopy, and the 2D disc nanostructures were able to generate hydrogen for over 125 hours.

Material Preparation.

$FeI_2$ (Sigma-Aldrich, anhydrous, ≥99.99%), sulfur powder (Sigma-Aldrich, Colloidal), carbon black (Alfa-Aesar, acetylene, 100% compressed, ≥99.9%), monobasic dihydrate sodium phosphate (Acros Organics, ≥99%), dibasic sodium phosphate (Acros Organics, anhydrous, ACS Reagent), (dimethylaminomethyl)ferrocene (Alfa Aesar, 98+%), octadecylamine (Acros Organics, technical grade, 90%), diphenyl ether (Acros Organics, 99%), chloroform (BDH, Anhydrous), methanol (Fischer Chemical, Certified ACS), tetrachloroethylene (Sigma-Aldrich, ACS) were all used as received.

Wire and Disc Synthesis:

To make the $FeS_2$ wires, 0.5 mmol of $FeI_2$ and 1 mL of phenyl ether was added to a septa sealed vial in a $N_2$ flushed glovebox. This mixture was sonicated to form a uniform slurry, approximately 1 hour. In a round bottom flask 12 g of ODA was added and degassed and backfilled with argon. The flask was then heated to 120° C., degassed and backfilled with argon again, and allowed to cool to ~80° C. The $FeI_2$ precursor solution was injected into the flask containing ODA and heated back to 120° C. and then left to stir for 1 hour to allow the precursor to decompose. In a separate flask, 128 mg of sulfur and 5 mL of phenyl ether was added and then degassed and backfilled with argon. This flask was heated to 70° C. and left to stir for 1 hour. After 1 hour, the sulfur solution was rapidly injected into the Fe-ODA solution and left to react at 120° C. for 4 hours. The solution was allowed to cool to ~100° C. before injection of 10 mL of chloroform to prevent the solution from congealing and then was transferred to centrifuge tubes, topped off with methanol, and centrifuged at 4000 rpm for 7 minutes. The supernatant was poured off and an additional 5 mL of chloroform and 40 mL of methanol was added, the solution mixed and centrifuged again. This step was repeated two more times resulting in a fluffy black solid that was suspended in chloroform and stored under nitrogen. The same procedure was used to make discs except only 0.125 mmol of $FeI_2$ was used. The average yield of the 2 syntheses was roughly around 70%, without the consideration of the mass loss during the cleaning process.

Materials Characterization.

UV-Vis absorbance spectra were taken on a UV-3600 Shimadzu UV-Vis-NIR spectrophotometer. X-ray powder diffraction was done at room temperature using monochromatic Cu-Kα radiation on a Bruker proteum diffraction system equipped with Helios multilayer optics, and APEX II CCD detector and a Bruker MicroStar microfocus rotation anode X-ray source operating at 45 kV and 60 mA. Powders were suspended in Paratone N oil and placed into a nylon loop and mounted on a goniometer head. Transmission electron microscope (TEM) images were obtained using a field emission FEI Tecnai F20 Xt. Energy dispersive X-ray (EDS) was done using an EDAX EDS with SiLi detector. Scanning electron microscope (SEM) images were obtained using a LEO 1550 field emission SEM. Fourier transform infrared spectroscopy (FTIR) was performed using a Nicolet 6700. Raman spectroscopy was performed using a Witec alpha 300 with a 633 nm wavelength laser.

Electrode Fabrication:

A suspension was made by combining 5 mg carbon black, 200 μL of 5 wt % Nafion solution (Fuel Cell Earth), and 1 mL of ~50 mg/mL of either the $FeS_2$ wires or discs suspended in chloroform. Because of the difference in conductivity and particle size between the wires/discs and the cubes, the $FeS_2$ cubes suspension was fabricated by combining 5 mg carbon black, 100 μL of 5 wt % Nafion solution, and 500 μL of $FeS_2$ cubes suspended in chloroform. Each nanostructure suspension was sonicated for ~15 min then <10 μL was dropcast on a 3 mm diameter glassy carbon electrode (CH Instruments) and allowed to dry for ~15 min before testing. The $FeS_2$ cubes were synthesized using a previously reported method.[22]

SECM Tip Electrode Fabrication:

A laser capillary pipet puller (Model P-2000, Sutter Instruments, USA), quartz capillaries (1 mm O.D., 0.3 mm I.D., 7.5 cm in length, Sutter Instruments, USA), 200 μm diameter Pt wire (Electron Microscopy Sciences 99.95% Pt wire), conductive silver epoxy (Circuit Works, USA), and silver connection wire (30 AWG, Belden, USA) were utilized in the fabrication of 200 μm SECM tip electrodes. MicroCloth polishing disks (Buehler, Canada), alumina micropolish (1 μm, 0.3 μm, Buehler, Canada), and MicroCut 1200 grit silicon carbide grinding paper (P2500, Buehler, Canada) were utilized to polish SECM tips before experiments.

Microdisk Pt electrodes 200 μm in diameter were fabricated for the SECM tip. The 200 μm Pt wire was centered in the quartz capillary before sealing the capillary to the wire and pulling to a tip with a laser capillary pipet puller (Sutter P-2000). Course polishing of the electrode tip with 1200 grit silicon carbide grinding paper was performed before fine polishing with 1 μm and 0.3 μm alumina micropolish, consecutively. Silver connection wire lightly coated with silver epoxy was inserted into the open end of the capillary tip electrode such that the silver epoxy was connecting the silver connection wire and the Pt wire. The SECM tip electrode was allowed to dry in a Model 30GC Lab Oven (Quincy Lab Inc) at ~100° C. for ~20 min before using.

SECM Instrumentation:

All reactivity maps were performed in a custom-built SECM including the following components from Newport: Vision Isostation air table (VIS2436-IG2-125A), faraday cage for air table, XPS Motion Controller/Driver with XPS-DRVP1 driver boards, 3-axis motion stage (VP-25XL-XYZL), 2 tilt stage motors (LTA-HS), and a Series 37 tilt stage. The SECM components were operated from an iMac computer via custom designed LabVIEW software while electrochemical measurements were collected via CH Instruments potentiostat (CHI730E).

Electrochemical Characterization:

Electrochemical measurements were performed in a glass cell with a simple 3-electrode configuration and carried out in a 0.1 M pH 7 phosphate buffer solution (PBS) bubbled with argon for ~5 min before use. The 0.1 M PBS was made by combining 4 mL of 1 M $NaH_2PO_4$ and 6 mL of 1 M $Na_2HPO_4$ and diluting with 90 mL of deionized Milli-Q water. The electrochemical measurements used either the $FeS_2$ coated 3 mm glassy carbon electrode, or a bare 3 mm glassy carbon electrode, or a bare 2 mm Pt electrode (CH Instruments) as the working electrode, a Pt wire (CH Instruments) as the counter electrode, and an Ag/AgCl electrode with porous Teflon tip (CH Instruments) as the reference electrode; however, the experiments were reported using the reversible hydrogen electrode as the reference potential. Linear sweep voltammetry (LSV) experiments were performed at 1 mV s$^{-1}$ with a CH660E potentiostat (CH Instruments). All reported LSVs were corrected for double-layer capacitance and uncompensated resistance. The FeS$_2$ discs stability test along with the Pt TOF calculations were performed by utilizing chronoamperometry at an applied potential of −0.14 V vs RHE, with stirring provided by a magnetic stir bar to overcome mass transfer limitations. Time average data was recorded with each data point corresponding to an average current over 5 minutes.

The scanning electrochemical microscopy (SECM) reactivity mapping experiments were performed in a Teflon cell using either the FeS$_2$ discs coated 3 mm glassy carbon electrode, or a bare 3 mm glassy carbon electrode, or a bare 2 mm Pt electrode as the substrate, a 200 μm Pt ultramicroelectrode (UME) as the SECM tip, a 200 μm Pt wire (Electron Microscopy Instruments) as the counter electrode, and an Ag/AgCl electrode with porous Teflon tip as the reference electrode with 0.1 M PBS, bubbled with argon for ~10 min, as the electrolyte. The SECM tip electrode was positioned approximately 100 μm away from the substrate electrode before scanning. Scanning was performed with the substrate electrode at a negative potential sufficient to produce hydrogen while the SECM tip electrode was held at a positive potential sufficient to collect hydrogen. A 666.67 μm/s scanning speed was utilized with 100 μm steps over a 3500 μm×3500 μm area for the Pt substrate electrode, or a 4000 μm×4000 μm area for the FeS$_2$ discs coated glassy carbon and bare glassy carbon substrate electrodes.

The SECM substrate generation/tip collection (SG/TC) experiments were performed in a Teflon cell with an FeS$_2$ discs coated 200 μm Au ultramicroelectrode (UME) as the substrate, a 200 μm Pt UME as the SECM tip, a 200 μm Pt wire (Electron Microscopy Instruments) as the counter electrode, and an Ag/AgCl electrode with porous Teflon tip as the reference electrode with 0.1 M PBS 0.5 mM (dimethylaminomethyl)ferrocene (DMAMFc), bubbled with argon for ~10 min, as the electrolyte, and scan rate of 10 mV/s.

Results and Discussion.

This Example utilizes a solution hot-injection method to create unique hyperthin iron sulfide nanostructures with atomic layer thickness. In the first step of the synthesis, an octadecylamine (ODA) ligand was added to a Fe$^{2+}$ solution, which formed ~3-5 nm iron nanoparticles as seen in the transmission electron microscopy, TEM, images (FIG. 1A, 1E). The ODA ligand acts as both a reducing agent for the Fe$^{2+}$ (Equation 1) and as a capping layer on the subsequent nanocrystal formation. Next, upon injection of sulfur, the iron seed particles oxidize to form Fe$^{2+}$ and S$_x^{2-}$ moieties (Equation 2) and these species form the FeS$_2$ nanostructures via Equations 3 and 4.

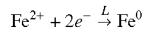
$$Fe^{2+} + 2e^- \xrightarrow{L} Fe^0 \quad \text{Equation 1}$$

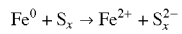
$$Fe^0 + S_x \rightarrow Fe^{2+} + S_x^{2-} \quad \text{Equation 2}$$

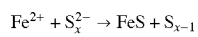
$$Fe^{2+} + S_x^{2-} \rightarrow FeS + S_{x-1} \quad \text{Equation 3}$$

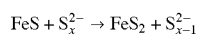
$$FeS + S_x^{2-} \rightarrow FeS_2 + S_{x-1}^{2-} \quad \text{Equation 4}$$

It was found that low dimensional structural formation could be tuned through adjustments of the initial sulfur concentration with two primary low dimensional FeS$_2$ nanostructures being observed. Changing the Fe:S ratio present in the precursor solutions formed either distinct wire or disc nanostructures. It was determined that a 1:6 Fe:S ratio yielded wires (FIGS. 1B, 1F) uniformly separated by a tightly packed layer of ligand (FIG. 1D) with a spacing of approximately 2.7 nm. Increasing the Fe:S ratio to 1:24 resulted in the formation of discs (FIGS. 1C, 1G) which appear in a stack of thin sheets also separated by a ligand layer.

The kinetics of the wire and disc reactions were tracked through (1) time dependent growth patterns monitored by TEM (FIGS. 2A-2C and 2E-2G); (2) energy-dispersive X-ray spectroscopy (EDS) measurements (FIG. 2I), which monitored the rate at which the Fe:S stoichiometry changed; and (3) UV-Vis-IR spectra (data not shown) which showed the changes in the relative peak heights of the FeS$_2$ characteristic set of absorbance peaks with respect to reaction time. The transition to FeS$_2$ was kinetically different between the wire and disc structures. The wire reaction (FIGS. 2A-2C) occurred relatively slowly, with the iron seed particles still present for several minutes into the reaction. Examination of the disc reaction (FIGS. 2E-2G) revealed faster kinetics with initial disc formation occurring within seconds of the injection and the seed particles being consumed minutes earlier than the wires. The EDS measurements correlate well with both the TEM and absorbance data. The wires reached the desired 1:2 stoichiometry after 30-60 minutes and maintained that stoichiometry for the duration of the reaction. The 1:24 Fe:S precursor ratio (discs) showed a faster conversion. Within 30 seconds, disc formations were observed, and 10 minutes into the reaction the discs reached a 1:2 Fe:S ratio. The scanning electron microscopy (SEM) characterization of the final wire structure (FIG. 2D) showed the bulk wires forming long bundled strands with lengths well over a micron which come together to form a porous sponge-like structure held together by ligand-ligand interactions. The SEM image of the final disc structure (FIG. 2H) also showed the stacking of discs to form larger structures with a range of diameters from 300 to 800 nm that most likely are connected by ligand-ligand interactions.

Figure 2J:
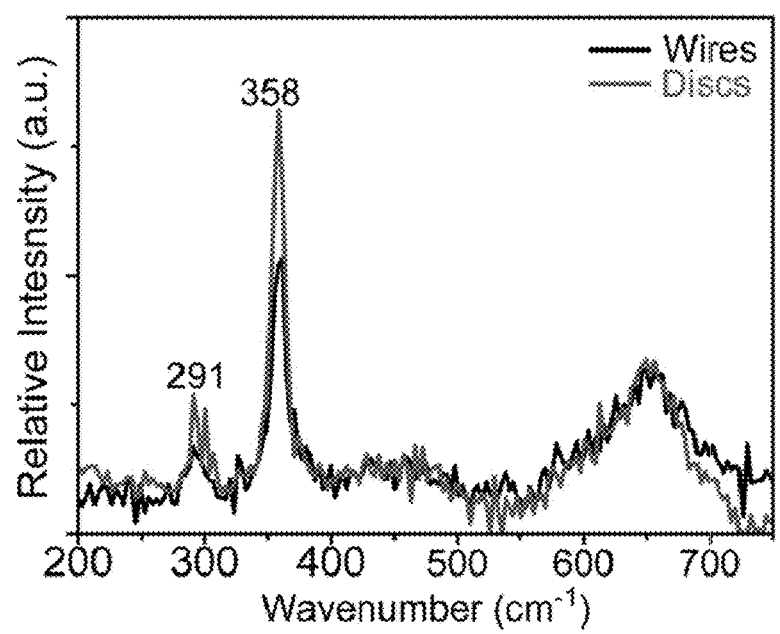
FIG. 2J shows the plot of the Raman spectroscopy data to establish phase identification.

Raman spectroscopy was used to further study the material (FIG. 2J). Both the wire and disc structures share a characteristic set of Raman peaks at 291 and 358 cm$^{-1}$.[24, 27] The combination of the EDS data and ordered nanostructures within TEM images led to the conclusion that these peaks correspond to an ordered FeS$_2$ structure. However, the thinness of these materials may not provide for accurate determination of the more typical Raman active modes[28, 29] of the usual FeS$_2$ phases (e.g. pyrite, marcasite) nor of the other typical Fe$_{1-x}$S phases. Similarly, X-ray diffraction (XRD, data not shown) confirmed the presence of Fe nanoparticles in the early stages but did not determine the phase in the final products, potentially due to the thinness of the material leading to insufficient scattering volume. However, analysis with high-resolution transmission electron microscopy (HRTEM) and electron diffraction as described below (see FIGS. 6A-6B) showed that the wire and disc structures were polycrystalline with majority marcasite phase.

Figure 3A:
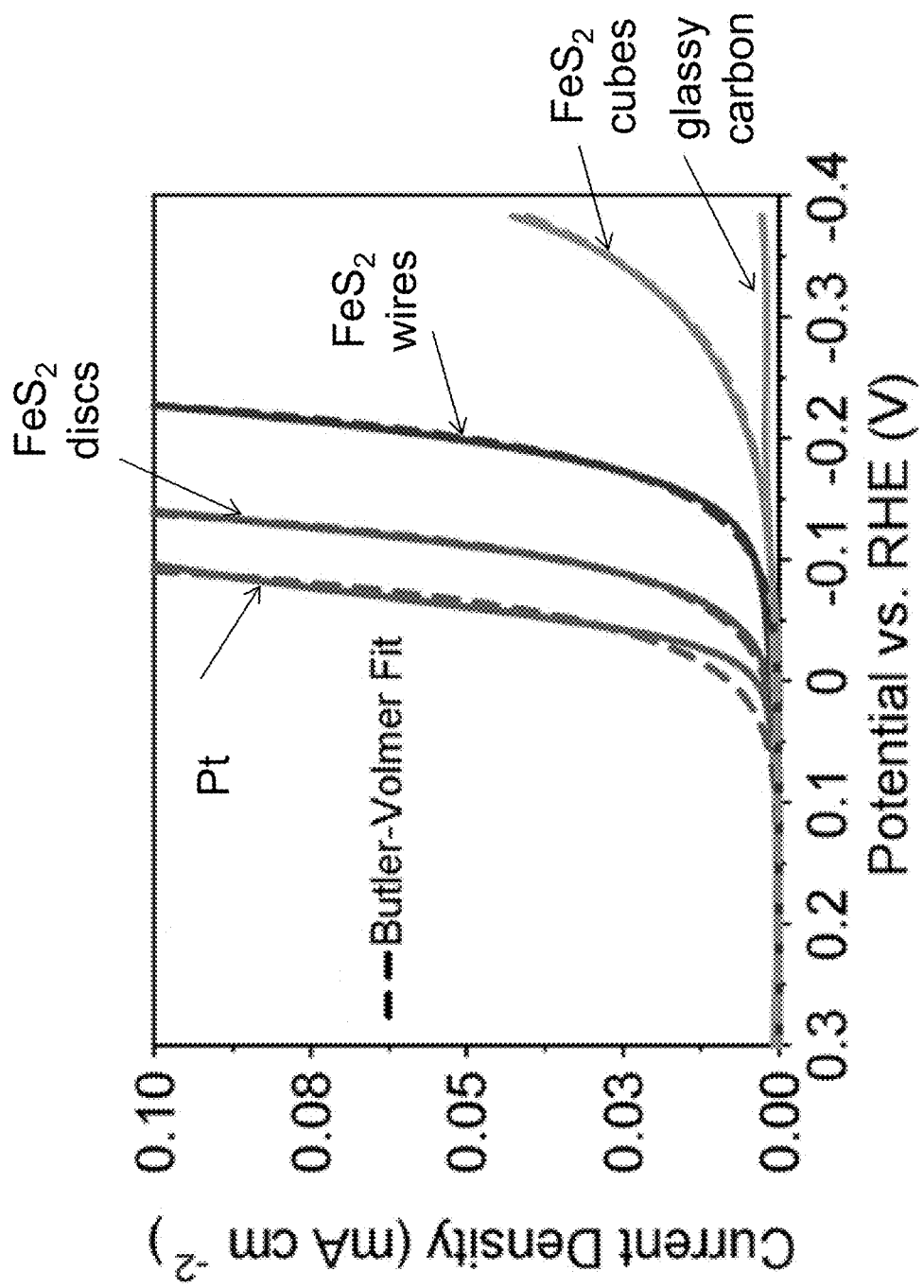
FIGS. 3A-3B show the electrochemical characterization of FeS$_2$ discs, wires, and cubes in 0.1 M pH 7 phosphate buffer solution (PBS) for the hydrogen evolution reaction.

The HER electrocatalytic activity of the nanostructured FeS$_2$ (drop-casted on a glassy carbon electrode) was measured via linear sweep voltammetry (LSV) at 1 mV/s in 0.1 M pH 7 phosphate buffer solution (PBS). FIG. 3A (solid lines) shows the capacitance and i-R corrected LSVs for the champion FeS$_2$ 1D wires, 2D discs, 3D cubes (TEM for the 3D FeS$_2$ cubes shown in FIG. 7) along with a blank glassy carbon electrode and Pt electrode. By synthesizing 2D FeS$_2$ nanostructures, the onset potential was shifted to very near the thermodynamic potential for hydrogen evolution (0 V vs RHE) indicative of exceptionally high electrocatalytic activity. In fact, these novel 2D FeS$_2$ nanostructures have an overpotential less than 50 mV larger than that of Pt. Triplicates of the LSV experiments obtained from separate batches of the FeS$_2$ 1D wires, 2D discs, and 3D cubes (the duplicate data is not shown) showed good reproducibility between samples with variances attributed to variability in electrode fabrication.

Figure 3B:
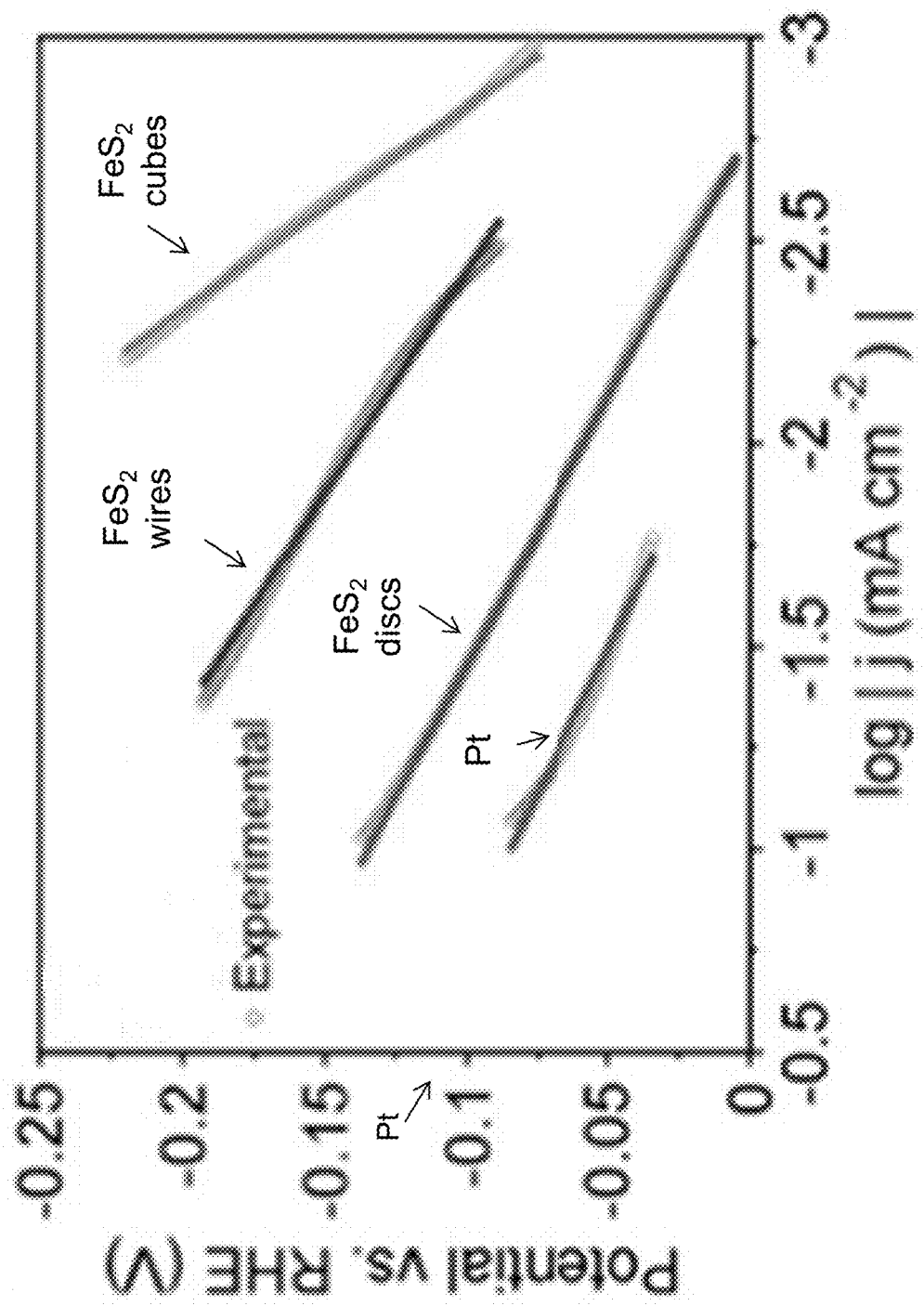

To quantify the electrocatalytic activity, the pseudo-steady state measurements were fit to the single-electron transfer Butler-Volmer equation (dashed lines, FIG. 3A) assuming no mass-transfer effects (Equation 5, below). This allowed for accurate exchange current densities and transfer coefficients to be obtained for each structure. It should be noted that at this pH and scan rate, the mass-transfer limited regime is reached at much lower currents than typically seen at faster scan rates (FIG. 8) or at lower pH.[30] From the Butler-Volmer equation, the exchange current density, which is a measure of kinetics for the hydrogen evolution reaction,[31] for the FeS$_2$ discs, wires, and cubes were determined to be 2.2, 0.32, and 0.41 μA cm$^{-2}$, respectively, while Pt had an exchange current density of 8.0 μA cm$^{-2}$. This shows that only the 2D FeS$_2$ disc nanostructures had an exchange current density on the same order of magnitude as Pt. A secondary calculation of the exchange current densities and transfer coefficients were obtained from Tafel analysis (FIG. 3B). The Tafel plot yielded exchange current densities of 6.3, 1.7, 0.30, and 0.47 μA cm$^{-2}$ for Pt and the FeS$_2$ discs, wires, and cubes, respectively. All of the exchange current densities as calculated via the Tafel plot are within 25% of those values calculated with the Butler-Volmer equation. Transfer coefficients and Tafel slopes for each electrode are shown in Table 1, below. Similar transfer coefficients and Tafel slopes between the 2D FeS$_2$ disc structure and Pt suggests that the 2D FeS$_2$ structure has a Pt-like HER mechanism in neutral pH.

TABLE 1

Kinetic parameters obtained from the Tafel analysis and Butler-Volmer Equations for Pt and the FeS$_2$ Discs, Wires and Cubes.

| | Tafel Slope | | | Butler-Volmer | |
|---|---|---|---|---|---|
| | Slope [mV decade$^{-1}$] | $j^0$ [μA cm$^{-2}$] | α | $j^0$ [μA cm$^{-2}$] | α |
| Discs | 76 | 1.7 | 0.76 | 2.2 | 0.71 |
| Wires | 91 | 0.30 | 0.64 | 0.32 | 0.65 |
| Cubes | 200 | 0.47 | 0.29 | 0.41 | 0.31 |
| Pt | 71 | 6.3 | 0.82 | 8.0 | 0.71 |

Figure 9:
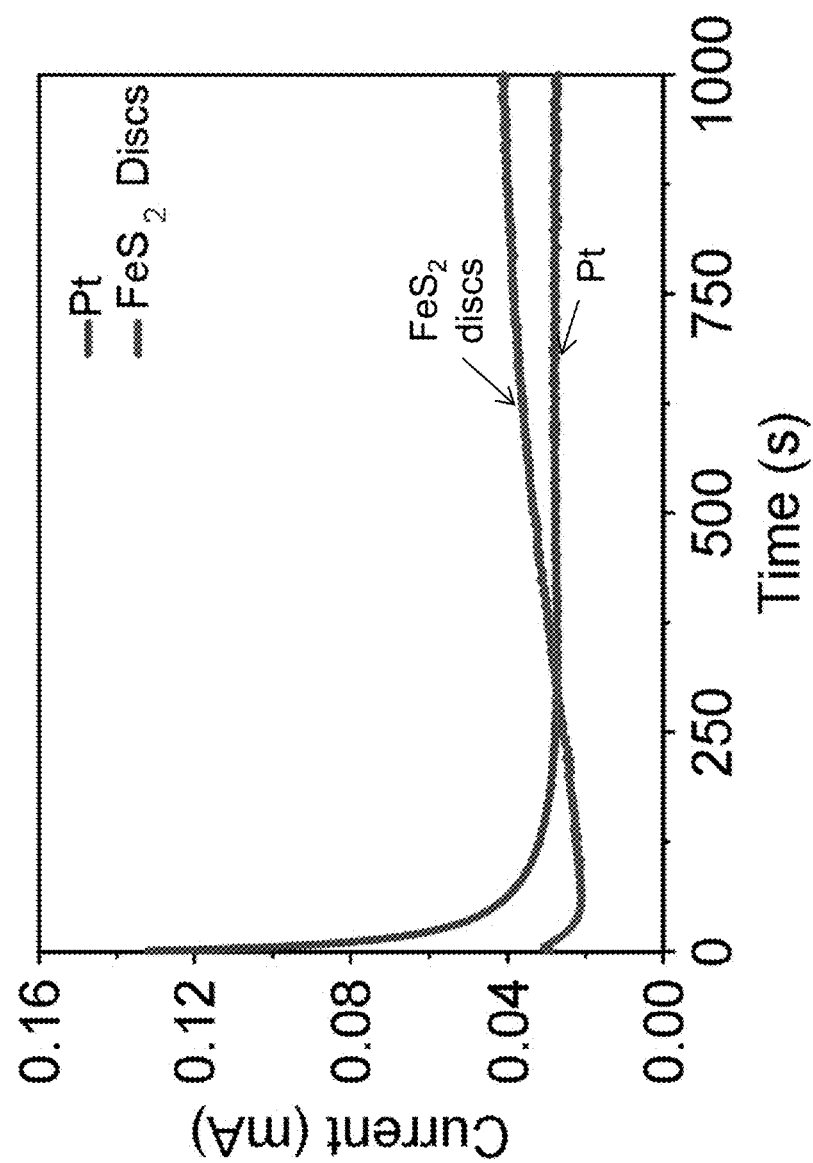
FIG. 9 shows current vs. Time plots for Pt and $FeS_2$ discs in stirred 0.1 M pH 7 phosphate buffer held at a constant potential of −0.14 V vs. RHE.

To determine the stability of the FeS$_2$ discs, a constant potential of −0.14 V vs RHE was applied for over 125 hours in 0.1 M pH 7 PBS while vigorously stirring, and the reduction current was measured as a function of time. The data (not shown) indicated that the reduction current did not change significantly over the 125-hour experiment. This suggests that, by maintaining reducing conditions (i.e. negative potentials) sufficient to evolve hydrogen, the FeS$_2$ discs catalyst is stable for generating hydrogen from water under neutral pH conditions. The turnover frequency (TOF) was calculated from Equation 6, below, using the data of reduction current versus time and the electrochemical surface area, which was calculated from double-layer capacitance measurements. The TOFs of the FeS$_2$ discs and the Pt electrode were determined to be 149 electrons h$^{-1}$ and 644 electrons h$^{-1}$ under the same conditions (FIG. 9) with the FeS$_2$ discs having more than double the electrochemical surface area than the Pt electrode.

To verify that hydrogen was evolving from the surface of the 2D FeS$_2$ discs, an HER electrochemical reactivity map was obtained via scanning electrochemical microscopy (SECM, FIGS. 4A-4D). SECM is a powerful technique for imaging the reactivity of electrocatalytic surfaces and for studying electrochemical reactions.[32-34] FIG. 4A shows the schematic for obtaining a hydrogen evolution electrochemical reactivity map. Here the catalytic electrode was held at a negative potential sufficient to evolve hydrogen and a 200 μm Pt SECM tip electrode was held at a positive potential sufficient to oxidize any hydrogen present in solution. The SECM tip electrode was placed c.a. 100 μm above the catalyst electrode and was scanned across the catalyst surface while the tip current was recorded as a function of tip position. Areas where hydrogen is being generated by the catalyst electrode will produce an oxidation current on the SECM tip electrode at that position.

HER electrochemical reactivity maps were obtained on the Pt electrode, the 2D FeS$_2$ discs coated on glassy carbon, and a bare glassy carbon electrode (FIGS. 4B-4D). Both the Pt (FIG. 4C) and the 2D FeS$_2$ discs-coated electrode (FIG. 4D) showed oxidation currents on the SECM tip electrode, indicative of hydrogen existing in solution over each electrode. For comparison, FIG. 4B showed no hydrogen in solution for the bare glassy carbon electrode operated at the same potential at which FIG. 4C was generated. Thus, via these SECM electrochemical reactivity maps, it can be concluded that the FeS$_2$ discs catalyst is indeed generating hydrogen gas.

Substrate generation/tip collection (SG/TC) SECM was used to estimate the Faradaic efficiency for hydrogen generation (FIGS. 11A-11D). In this experiment a 200 μm Pt tip electrode was positioned over a 200 μm Au substrate electrode coated with FeS$_2$ discs, and linear sweep voltammetry was performed on the FeS$_2$ electrode and the Pt tip electrode collected the evolved hydrogen as a function of potential. Using the SG/TC SECM technique, the faradaic efficiency of the FeS$_2$ discs for hydrogen evolution is estimated to be 92±8%.

Additional Results and Discussion

Additional results and discussion relating to materials characterization and electrochemical characterization are provided.

Materials Characterization:

The low temperature phase of the FeS$_2$ 1D and 2D structures could not be characterized by Raman spectroscopy or XRD measurements because of the atomic layer thickness of the structures. However, HRTEM and electron diffraction measurements described below (see FIGS. 6A-6B) confirmed the structures were polycrystalline with majority marcasite phase. As such, the standard characterization methods (Raman/XRD) of these 1D and 2D structures yielded results that are different than the 3D high temperature phases. UV-Vis-IR measurements were taken of aliquots of wire and disc reactions at 0.5, 5, 10, 30, 90, and 240 minutes. Initially peaks are not readily apparent, but after reaction times greater than 1 minute the characteristic peaks appear at 320, 430, 530, 660, and 700 nm in both the wire and the disc reactions (data not shown). (See Wilcoxon, J. P.; Newcomer, P. P.; Samara, G. A. *Solid State Commun.* 1996, 98, 581-585 and Gong, M.; Kirkeminde, A.; Ren, S. *Sci. Rep.* 2013, 3, 2092.) Optically the 2-D growth of the discs causes rapid peak formation with little difference between scans at earlier and later reaction times. The 1D growth of the wires shows slower peak formation. In the early stages of the wire reaction, the shorter wavelengths dominate the spectra and have the highest relative intensities. However, as the reaction progresses, the peaks at 660 and 700 nm proceed to become the dominant peaks with the 700 nm peak appearing as a lower intensity shoulder. The absorbance spectra stabilize when the 700 nm shoulder eclipses the 660 nm peak achieving the highest maximum relative intensity of all the characteristic peaks.

Figure 5:
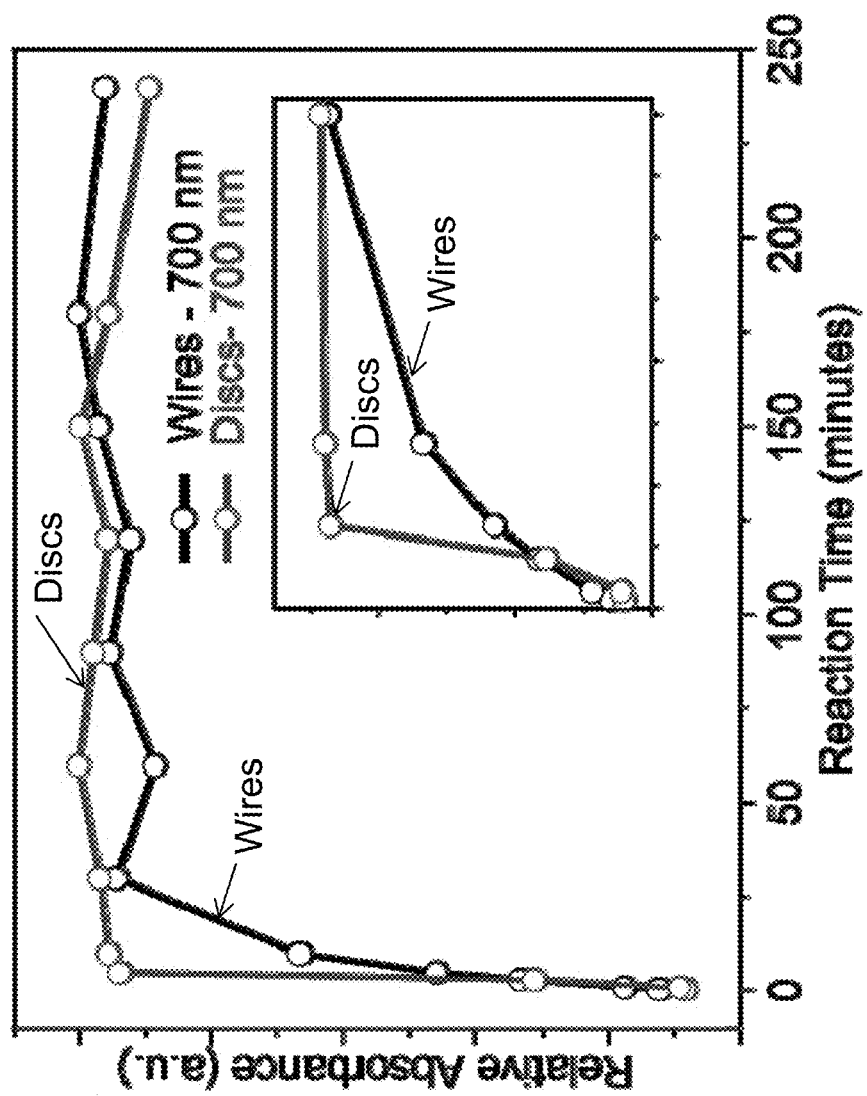
FIG. 5 shows the growth of the peak at 700 nm from UV-Vis-IR measurements of $FeS_2$ wire and disc formations as tracked over the course of the reaction with the inset focusing on the first 30 minutes to illustrate the relative changes.

For clarity, the growth of the 700 nm absorbance peak over the course of the reaction was plotted (FIG. 5) and shows a strong correlation with the EDS data monitoring stoichiometry. The fact that the 700 nm peak grows in and does not appear to shift as it grows suggests a structural (i.e. stoichiometry) change instead of a size dependent shift in peak absorbance because of confinement. Additionally the rate and time at which the 700 nm peak reaches its maximum could be used as an in-situ method for characterizing wires or discs formation as well as reaction progress, respectively.

Characterization by XRD (data not shown) was used to determine crystal structure and structural evolution during the course of the reaction. Initially, it was found that crystalline iron particles had formed prior to the injection of the sulfur, and persisted for the first few minutes of the reaction. The match to iron oxide is a result of exposure of these small particles to open air during the measurement. Further along in the reaction, the iron oxide peaks disappear and what is left is mostly noise with small peaks observed that do not match with the typical 1:2 Fe:S structures of iron pyrite or marcasite. Numerous other $Fe_xS_y$ XRD patterns were investigated but none matched appropriately. This may be caused by the limitations of the XRD when scanning particles with atomic layer dimensions. In addition, as the low-dimensional $FeS_2$ hyperthin nanostructured materials are susceptible to the irradiation damage (primarily the oxidation issue) during the XRD measurement, it did not serve as a reliable source to characterize the $FeS_2$. However, the HRTEM and electron diffraction measurements described below (see FIGS. 6A-6B) confirm the majority marcasite phase of the materials.

Figure 6A:
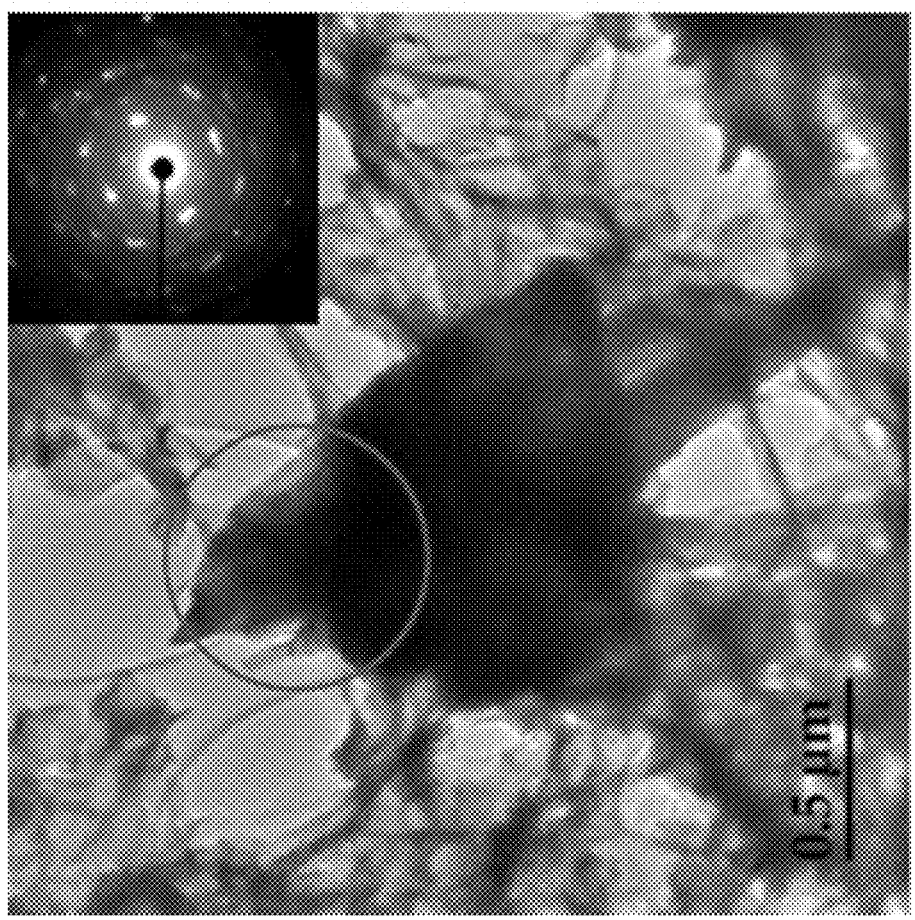
FIGS. 6A-6B show TEM images of crystalline $FeS_2$ discs. A $FeS_2$ disc with 1 μm diameter is shown in FIG. 6A, the circle indicates the area where SAED pattern (insert) was taken.
Figure 6B:
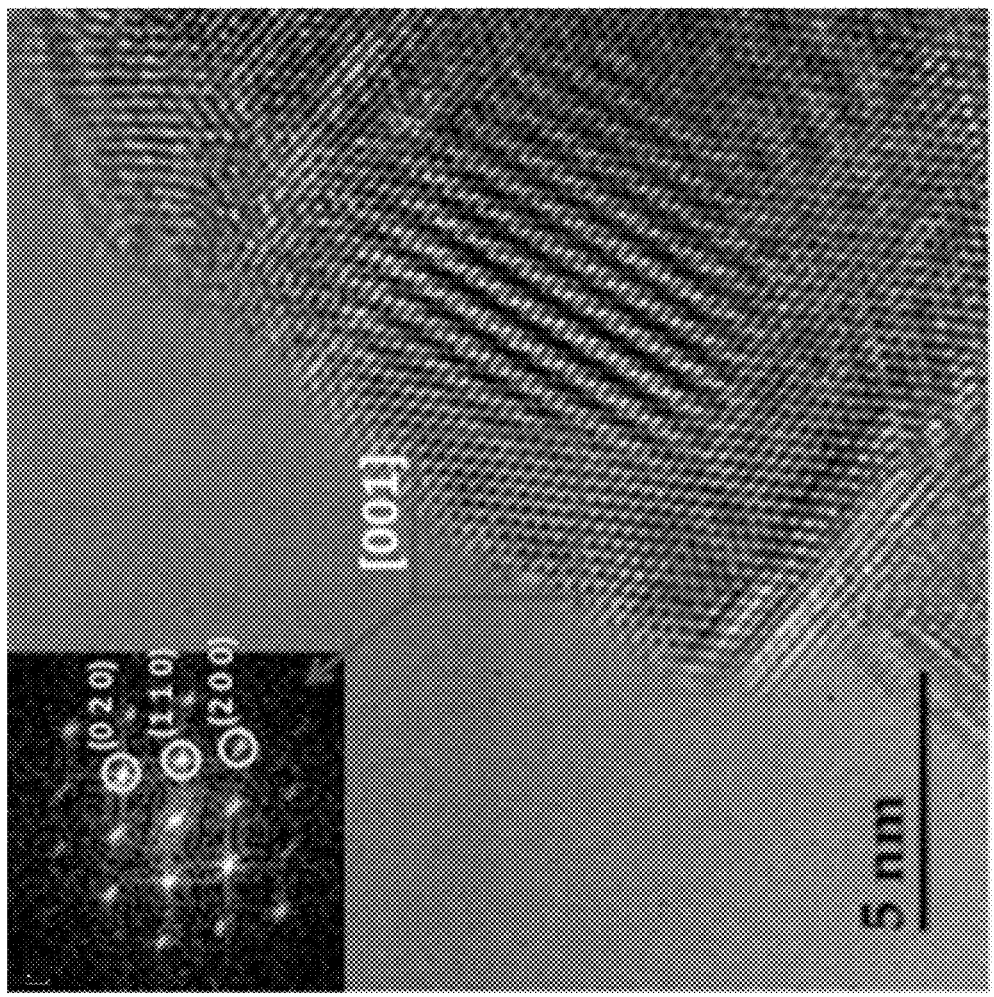

TEM images of crystalline $FeS_2$ discs are shown in FIGS. 6A-6B. In FIG. 6A, a low magnification image shows a $FeS_2$ disc with 1 μm diameter. Select area electron diffraction (SAED) pattern was taken from the red circled area to confirm its crystallinity, as shown in the insert. High resolution TEM image of a $FeS_2$ disc is shown in FIG. 6B. FFT of the squared area (insert) shows characteristic diffraction peaks of the (020), (110), and (200) planes from marcasite $FeS_2$, indicating the image was taken from its [001] direction. Thus, this data shows that the material is polycrystalline with majority marcasite phase.

Electrochemical Characterization:

Equation 5 is an approximate form of the single-electron transfer Butler-Volmer Equation (Bard, A.; Faulkner, L., *Electrochemical Methods: Fundamentals and Applications*. John Wiley & Sons, Inc: 2001, New York, pp. 100) assuming an irreversible reaction with no mass transfer effects and a large overpotential. The equation describes the relation between the current density, j, and the overpotential, η, which is equivalent to the electrode potential versus RHE. The exchange current density, $j_0$, and the transfer coefficient, α, are the two kinetic parameters that were regressed from the LSV data, F is the Faraday constant, R is the universal gas constant, and T is temperature.

$$j = j_0 e^{-\frac{\alpha \eta F}{RT}} \quad \text{Equation 5}$$

As stated above, triplicates of the LSV experiments were obtained from separate batches of the $FeS_2$ 1D wires, 2D discs, and 3D cubes (data not shown). While the champion data from each set has been reported above, good reproducibility was obtained with no overlap between the worst 2D discs and best 1D wires, and no overlap between the worst 1D wires and best 3D cubes. Differences between samples were attributed to variability in electrode fabrication. For comparison, FIG. 7 shows the TEM image of the 3D $FeS_2$ cubes to the 1D wire and 2D disc structures.

As described above, it was also demonstrated that high stability of these catalysts can be obtained when held under reducing conditions to evolve hydrogen. However, exposure of the $FeS_2$ nanostructures to oxidizing potentials causes deactivation. Thus, it should be noted that the catalytic activity of the $FeS_2$ nanostructures decreases between scans when multiple cyclic voltammetry experiments are performed in the range of +0.3 to -0.3 V vs RHE on the same electrode.

For all electrochemical measurements, uncompensated resistance measurements were made via the "iR Comp" function on the CHI 660E Potentiostat software. The potential of all LSVs were then corrected for the uncompensated resistance. Measurements of uncompensated resistance in the samples were in the range of 100-520Ω. Double-layer capacitance was also corrected for by subtracting background current (or current density) obtained from an extrapolated CV performed in the potential region before the onset of hydrogen evolution. The raw experimental data with no capacitance or iR correction for the data shown in FIG. 3A, above, and for the duplicate LSV experiments is not shown.

Figure 8A:
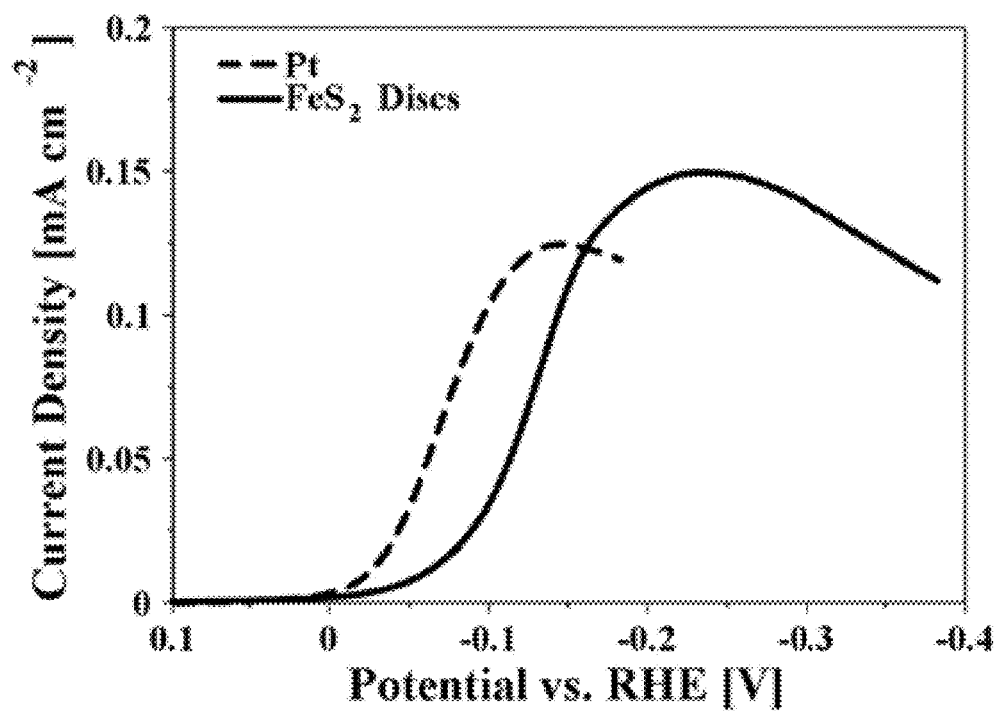
FIG. 8A shows Linear Sweep Voltammograms (LSVs) of Pt and $FeS_2$ Discs at a scan rate of 1 mV/s showing the mass-transfer limited regime.
Figure 8B:
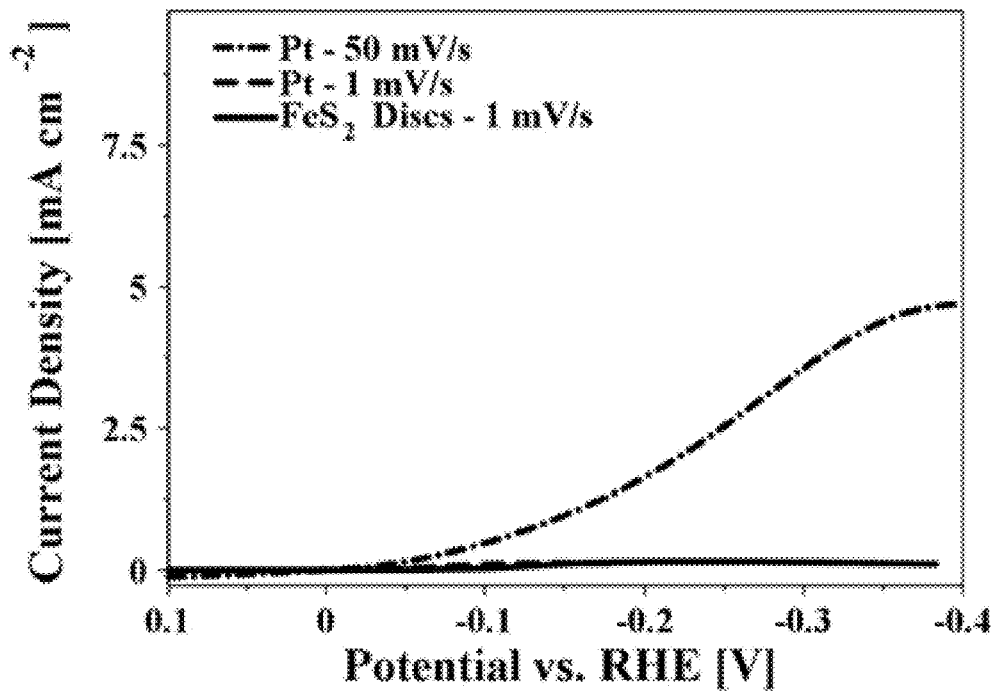
FIG. 8B shows LSVs in FIG. 8A overlaid with a LSV of Pt at a scan rate of 50 mV/s.
Figure 8C:
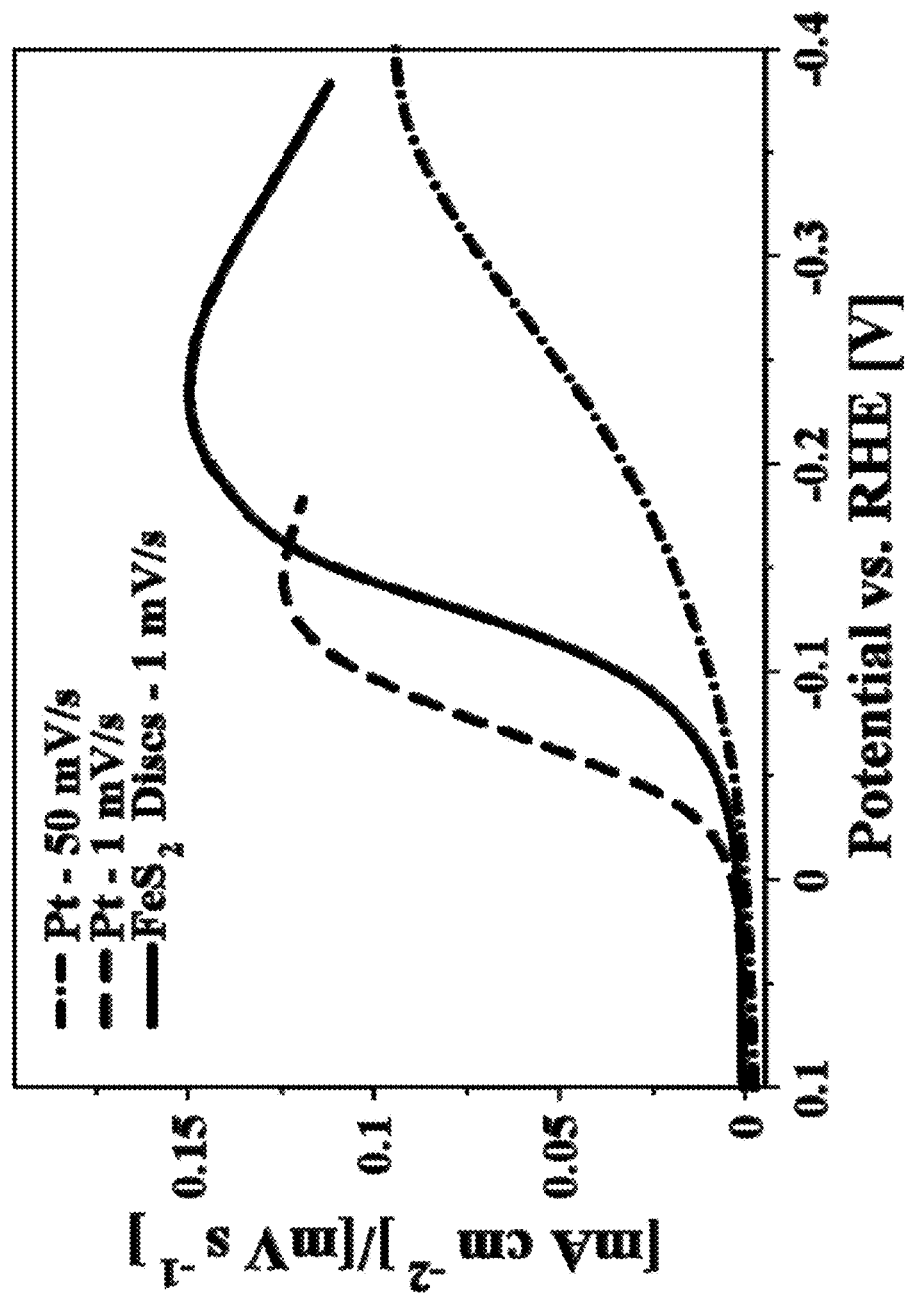
FIG. 8C shows the LSVs in FIG. 8B with the current density normalized by scan rate.

As stated above, linear sweep voltammograms (LSVs) of the $FeS_2$ nanoparticles were carried out at 1 mV/s so that a pseudo-steady state current could be reached at each potential. In FIG. 8A, it can be seen that the system becomes mass transfer limited at modest current densities, but both the Pt and the $FeS_2$ disc reach the mass transfer limited regime at similar current densities. The mass transfer limited regime for Pt at 50 mV/s (FIG. 8B) occurs at much higher current densities than for Pt at 1 mV/s because of the transients and steeper concentration gradients occurring from a faster scan rate. FIG. 8C shows the LSVs with current density normalized by scan rate to illustrate the dependence of current on scan rate.

The turnover frequency (TOF) was calculated with Equation 6.

$$TOF = \frac{iN_{Avo}}{A_{EC}FN} \quad \text{Equation 6}$$

where i is the current, $N_{Avo}$ is Avogadro's constant, $A_{EC}$ is the electrochemical surface area, F is Faraday's constant, and N is approximated as $10^{15}$ atoms $cm^{-2}$. The electrochemical surface area was determined from standard active surface area calculations based on capacitance assuming 20 μF $cm^{-2}$ as described above. The surface area was 4.8 and 1.0 $cm^2$ for the $FeS_2$ discs and Pt, respectively. The roughness factor (electrochemical surface area/geometric area) was found to be 68 for the $FeS_2$ discs and 31 for Pt. The raw data from which the current, i, was obtained can be seen in FIG. 9.

Figure 10:
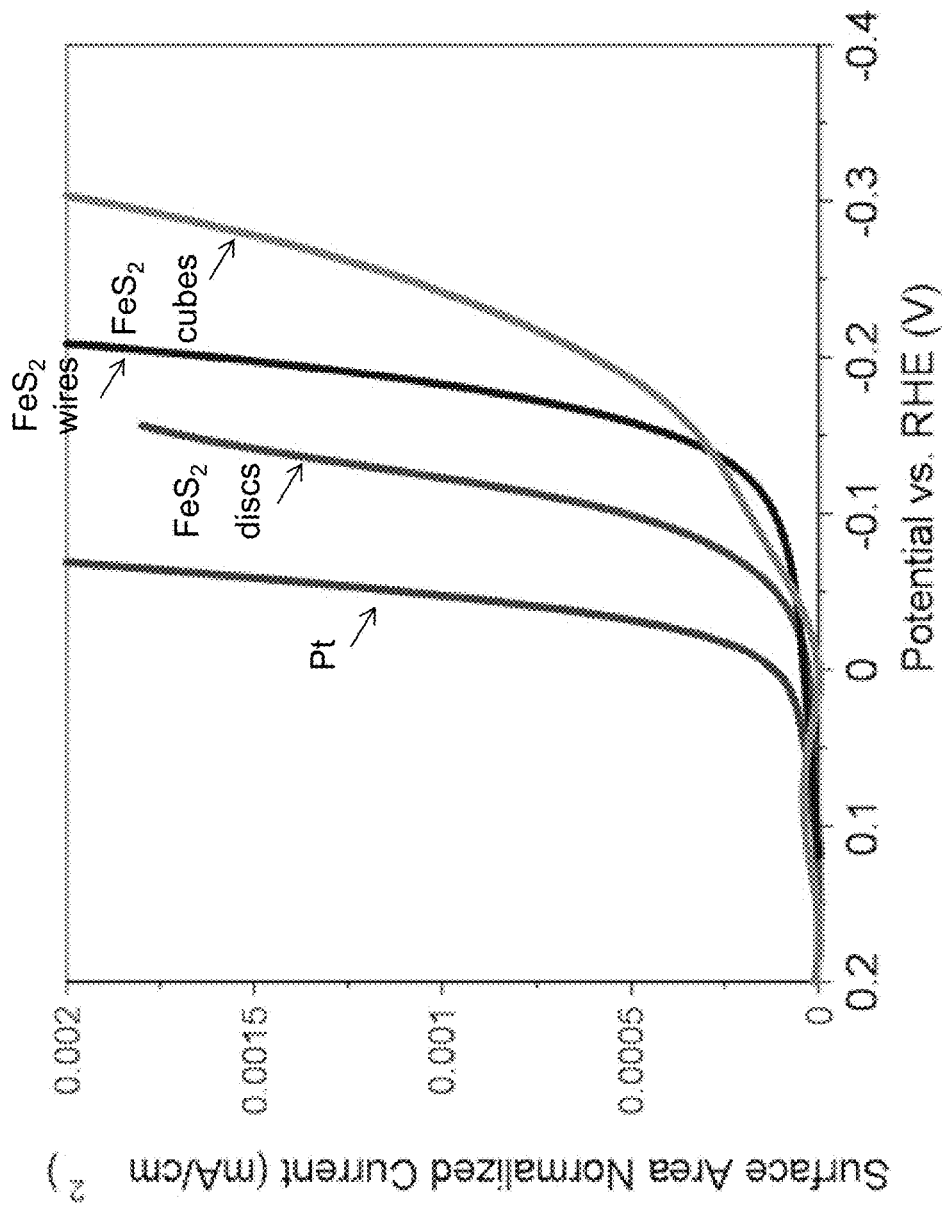
FIG. 10 shows electrochemical surface area normalized linear sweep voltammograms of Pt, and $FeS_2$ discs, wires, and cubes in 0.1 M pH 7 phosphate buffer solution (PBS) for the hydrogen evolution reaction at 1 mV/s.

Similar measurements of the electrochemical surface area were also obtained for the wires and cubes. The wires had an electrochemical surface area of 2.3 $cm^2$ and the cubes had an electrochemical surface area of 0.56 cm$^2$. This corresponds to roughness factors of 33 and 8 respectively. FIG. 10 shows the LSVs showing the surface area normalized current as a function of potential.

The Faradaic efficiency of hydrogen evolution on the FeS$_2$ disc was estimated from a SECM substrate generation/tip collection (SG/TC) experiment (data not shown). In this experiment a 200 μm Pt tip electrode was positioned over a 200 μm Au electrode coated with FeS$_2$ disc substrate electrode. Linear sweep voltammetry was performed on the FeS$_2$ electrode and the Pt tip electrode collected the evolved hydrogen as a function of potential. However, the first step in performing SG/TC SECM to obtain the faradaic efficiency for hydrogen evolution is to determine the maximum collection efficiency using an outer-sphere redox mediator. The maximum collection efficiency can be under 100% because of misalignment of the tip to the substrate.

The redox mediator used to determine the theoretical maximum collection efficiency was (dimethylaminomethyl) ferrocene, DMAMFc, ($E^{1/2}$~0.35 V vs. Ag/AgCl). However, the FeS$_2$ discs were found to deactivate under oxidizing potentials required to approach, align the tip and substrate, and perform the DMAMFc$^+$ SG/TC SECM. Thus, a quick approach and map were required, resulting in misalignment of the substrate and the SECM tip. This resulted in a maximum collection efficiency for DMAMFc/DMAMFc$^+$, of 1.6%. The DMAMFc/DMAMFc$^+$ SG/TC SECM data was corrected for the collection efficiency. Also the large tip/substrate distance caused a delay in the collection of DMAMFc$^+$, which was corrected for.

The hydrogen SG/TC data was corrected for the maximum collection efficiency of the DMAMFc SG/TC experiment. In addition the large tip/substrate distance caused a delay in hydrogen collection by the SECM tip due to a large diffusion distance between the tip and substrate, as was also the case for the DMAMFc$^+$ collection. Corrections for capacitance were also performed as described above. Due to the low collection efficiency is was difficult to exactly quantify the faradaic efficiency of hydrogen because small variations in the collection efficiency of DMAMFc propagate through in calculating the Faradaic efficiency of hydrogen. However using this method an estimate of hydrogen Faradaic efficiency of the FeS$_2$ discs was determined to be 92±8%.

CONCLUSION

In summary, this Example reports a novel synthesis method to create 2D FeS$_2$ nanostructures, which significantly improves the electrocatalytic performance of earth-abundant FeS$_2$ for the HER. It was found that the morphology and stoichiometry of the FeS$_2$ could be tuned by the initial sulfur concentration. The 1D FeS$_2$ wires and the 2D FeS$_2$ discs showed higher electrocatalytic activity compared to the conventional 3D FeS$_2$ cubes for the HER under neutral pH conditions. In fact, the 2D FeS$_2$ materials displayed excellent electrochemical activity—similar to platinum—with high exchange current densities and an onset potential for hydrogen evolution near the thermodynamic potential. The 2D FeS$_2$ discs also proved to be remarkably stable demonstrating the ability to generate hydrogen for over 125 hours when under reducing conditions. Using SECM, it was verified that hydrogen was being generated from both the Pt and FeS$_2$ discs electrodes, but not from a bare glassy carbon electrode.

REFERENCES

1. Kanan, M. W.; Nocera, D. G. *Science* 2008, 321, 1072-1075.
2. McKone, J. R.; Warren, E. L.; Bierman, M. J.; Boettcher, S. W.; Brunschwig, B. S.; Lewis, N. S.; Gray, H. B. *Energy Environ. Sci.* 2011, 4, 3573-3583.
3. Leonard, K. C.; Bard, A. J. *J. Am. Chem. Soc.* 2013, 135, 15885-15889.
4. McKone, J. R.; Lewis, N. S.; Gray, H. B. *Chem. Mater.* 2014, 26, 407-414.
5. Lewis, N. S.; Nocera, D. G. *Proc. Natl. Acad. Sci. U.S.A* 2006, 103, 15729-15735.
6. Gray, H. B. *Nature Chemistry* 2009, 1, 7-7.
7. Yang, J.; Shin, H. S. *J. Mater. Chem. A* 2014, 2, 5979-5985.
8. Kong, D. S.; Cha, J. J.; Wang, H. T.; Lee, H. R.; Cui, Y. *Energy Environ. Sci.* 2013, 6, 3553-3558.
9. Lukowski, M. A.; Daniel, A. S.; Meng, F.; Forticaux, A.; Li, L. S.; Jin, S. *J. Am. Chem. Soc.* 2013, 135, 10274-10277.
10. Di Giovanni, C.; Wang, W.-A.; Nowak, S.; Greneche, J.-M.; Lecoq, H.; Mouton, L.; Giraud, M.; Tard, C. *ACS Catal.* 2014, 4, 681-687.
11. Peng, Z.; Jia, D.; Al-Enizi, A. M.; Elzatahry, A. A.; Zheng, G. *Adv. Energy Mater.* 2015, 5, DOI: 10.1002/aenm.201570050.
12. Sun, Y.; Liu, C.; Grauer, D. C.; Yano, J.; Long, J. R.; Yang, P.; Chang, C. J. *J. Am. Chem. Soc.* 2013, 135, 17699-17702.
13. Li, Y. G.; Wang, H. L.; Xie, L. M.; Liang, Y. Y.; Hong, G. S.; Dai, H. J. *J. Am. Chem. Soc.* 2011, 133, 7296-7299.
14. Jaramillo, T. F.; Jorgensen, K. P.; Bonde, J.; Nielsen, J. H.; Horch, S.; Chorkendorff, I. *Science* 2007, 317, 100-102.
15. Yu, Y. F.; Huang, S. Y.; Li, Y. P.; Steinmann, S. N.; Yang, W. T.; Cao, L. Y. *Nano Lett.* 2014, 14, 553-558.
16. Wu, Z. Z.; Fang, B. Z.; Bonakdarpour, A.; Sun, A. K.; Wilkinson, D. P.; Wang, D. Z. *Appl. Catal., B* 2012, 125, 59-66.
17. Faber, M. S.; Lukowski, M. A.; Ding, Q.; Kaiser, N. S.; Jin, S. *J. Phys. Chem. C* 2014, 118, 21347-21356.
18. Wadia, C.; Alivisatos, A. P.; Kammen, D. M. *Environ. Sci. Technol.* 2009, 43, 2072-2077.
19. Macpherson, H. A.; Stoldt, C. R. *ACS Nano* 2012, 6, 8940-8949.
20. Bai, Y. X.; Yeom, J.; Yang, M.; Cha, S. H.; Sun, K.; Kotov, N. A. *J. Phys. Chem. C* 2013, 117, 2567-2573.
21. Kirkeminde, A.; Ruzicka, B. A.; Wang, R.; Puna, S.; Zhao, H.; Ren, S. Q. *ACS Appl. Mater. Interfaces* 2012, 4, 1174-1177.
22. Kirkeminde, A.; Gingrich, P.; Gong, M. G.; Cui, H. Z.; Ren, S. Q. *Nanotechnology* 2014, 25, 205063.
23. Ennaoui, A.; Fiechter, S.; Tributsch, H.; Giersig, M.; Vogel, R.; Weller, H. *J. Electrochem. Soc.* 1992, 139, 2514-2518.
24. Chatzitheodorou, G.; Fiechter, S.; Konenkamp, R.; Kunst, M.; Jaegermann, W.; Tributsch, H. *Mater. Res. Bull.* 1986, 21, 1481-1487.
25. Aricò, A. S.; Antonucci, V.; Antonucci, P. L.; Modica, E.; Ferrara, S.; Giordano, *Mater. Lett.* 1992, 13, 12-17.
26. Rosso, K. M.; Becker, U.; Hochella, M. F. *Am. Mineral.* 1999, 84, 1535-1548.
27. Yu, B.-B.; Zhang, X.; Jiang, Y.; Liu, J.; Gu, L.; Hu, J.-S.; Wan, L.-J. *J. Am. Chem. Soc.,* 2015, 137 (6), 2211-2214
28. Vogt, H.; Chattopadhyay, T.; Stolz, H. J. *J. Phys. Chem. Solids* 1983, 44, 869-873.
29. Lutz, H. D.; Muller, B. *Phys. Chem. Miner.* 1991, 18, 265-268.
30. Costentin, C.; Canales, J. C.; Haddou, B.; Saveant, J.-M. *J. Am. Chem. Soc.* 2013, 135, 17671-17674.

31. Bard, A.; Faulkner, L., *Electrochemical Methods: Fundamentals and Applications.* John Wiley & Sons, Inc: 2001, New York, pp. 100.
32. Leonard, K. C.; Bard, A. J. *J. Am. Chem. Soc.* 2013, 135, 15890-15896.
33. Bard, A. J.; Fan, F. R. F.; Pierce, D. T.; Unwin, P. R.; Wipf, D. O.; Zhou, F. M. *Science* 1991, 254, 68-74.,
34. Sun, T.; Yu, Y.; Zacher B. J.; Mirkin, M. V. *Angew. Chem., Int. Ed.* 2014, 53, 14120-14123.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An electrode comprising a $FeS_2$ electrocatalytic material, the $FeS_2$ electrocatalytic material comprising $FeS_2$ nanostructures in the form of $FeS_2$ wires, $FeS_2$ discs, or both, wherein the $FeS_2$ wires and the $FeS_2$ discs are hyperthin having a thickness in the range of from about the thickness of a monolayer of $FeS_2$ molecules to about 20 nm, and further wherein the $FeS_2$ nanostructures are polycrystalline comprising a non-pyrite majority crystalline phase.

2. The electrode of claim 1, wherein the thickness is in the range of from about the thickness of a monolayer of $FeS_2$ molecules to about 10 nm.

3. The electrode of claim 1, wherein substantially all the $FeS_2$ discs have at least partially curved edges.

4. The electrode of claim 3, wherein substantially all the $FeS_2$ discs have entirely curved edges.

5. The electrode of claim 3, wherein the $FeS_2$ discs comprise circular $FeS_2$ discs, elliptical $FeS_2$ discs, or both.

6. The electrode of claim 1, wherein the non-pyrite majority crystalline phase is marcasite.

7. The electrode of claim 1, wherein the $FeS_2$ wires are assembled in the form of bundles, wherein neighboring wires within each bundle are substantially aligned along their lengths and separated by a ligand layer and the $FeS_2$ discs assembled in the form of stacks, wherein neighboring discs within each stack are substantially aligned along their planes and separated by a ligand layer.

8. The electrode of claim 7, wherein the bundles or stacks are randomly oriented with respect to one another to define a plurality of pores distributed through the material.

9. An electrode comprising a $FeS_2$ electrocatalytic material, the $FeS_2$ electrocatalytic material comprising $FeS_2$ nanostructures in the form of $FeS_2$ discs, wherein the $FeS_2$ discs are hyperthin having a thickness in the range of from about the thickness of a monolayer of $FeS_2$ molecules to about 20 nm, and further wherein substantially all the $FeS_2$ discs have at least partially curved edges.

10. The electrode of claim 9, wherein substantially all the $FeS_2$ discs have entirely curved edges.

11. An electrochemical system for catalyzing an electrochemical reaction, the system comprising:
    (a) an electrochemical cell configured to contain a fluid comprising an electrochemical reactant;
    (b) the electrode of claim 1 in contact with the fluid; and
    (c) a counter electrode in electrical communication with the electrode of claim 1.

12. The electrochemical system of claim 11, further comprising a power source configured to apply an electrical potential across the electrode of claim 1 and the counter electrode in order to generate free electrons for inducing a reduction reaction at the electrode of claim 1.

13. The electrochemical system of claim 12, wherein electrochemical reaction is the hydrogen evolution reaction, the fluid is an aqueous electrolyte solution, and the reduction reaction is the generation of $H_2$ from hydrogen ions and the free electrons.

14. A method for making the electrode of claim 1, the method comprising:
    (a) injecting a first precursor solution comprising sulfur (S), the first precursor solution having a first temperature, into a second precursor comprising iron (Fe), the second precursor solution having a second temperature, to form a reaction mixture, and
    (b) allowing the reaction mixture to react at a reaction temperature for a reaction time,
    wherein a ratio of Fe:S in the first and second precursor solutions is selected to achieve the nanostructures in the form of $FeS_2$ wires, $FeS_2$ discs, or both, wherein the $FeS_2$ wires and the $FeS_2$ discs are hyperthin having the thickness in the range of from about the thickness of a monolayer of $FeS_2$ molecules to about 20 nm, and further wherein the $FeS_2$ wires and the $FeS_2$ discs are polycrystalline comprising the non-pyrite majority crystalline phase.

15. The method of claim 14, wherein substantially all the nanostructures are in the form of $FeS_2$ discs and the ratio of Fe:S in the first and second precursor solutions is in the range of from about 1:24 to about 1:38.

16. A method of using the electrode of claim 1 to catalyze an electrochemical reaction, the method comprising exposing the $FeS_2$ electrocatalytic material to a fluid comprising an electrochemical reactant under conditions sufficient to induce the reduction of the electrochemical reactant at the $FeS_2$ electrocatalytic material-fluid interface to form a reduction product or under conditions sufficient to induce the oxidation of the electrochemical reactant at the $FeS_2$ electrocatalytic material-fluid interface to form an oxidation product.

17. The method of claim 16, wherein the electrochemical reaction is the hydrogen evolution reaction, the fluid is an aqueous electrolyte solution, the electrochemical reactant comprises hydrogen ions which are induced to form hydrogen gas as the reduction product in the presence of free electrons.

18. The method of claim 17, wherein the electrochemical reaction occurs at about neutral pH.

19. The method of claim 17, wherein substantially all the nanostructures are in the form of $FeS_2$ discs.

20. The method of claim 19, wherein the method is characterized by an overpotential of no more than about 90 mV as determined at 0.1 $mA/cm^2$ in a 0.1 M phosphate buffer at a pH of 7 and a scan rate of 1 mV/s.

* * * * *